(12) United States Patent
Hirakimoto et al.

(10) Patent No.: US 6,978,431 B2
(45) Date of Patent: Dec. 20, 2005

(54) AUTOMATIC PLACEMENT AND ROUTING APPARATUS AUTOMATICALLY INSERTING A CAPACITIVE CELL

(75) Inventors: Koji Hirakimoto, Hyogo (JP); Yoshio Inoue, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 345 days.

(21) Appl. No.: 10/374,059

(22) Filed: Feb. 27, 2003

(65) Prior Publication Data

US 2004/0031007 A1 Feb. 12, 2004

(30) Foreign Application Priority Data

Aug. 7, 2002 (JP) ............................. 2002-230086

(51) Int. Cl.[7] .............................................. G06F 9/45
(52) U.S. Cl. ............................................ 716/10; 716/2
(58) Field of Search .............................. 716/1, 8, 9, 10, 716/12, 17

(56) References Cited

U.S. PATENT DOCUMENTS

| | | | | |
|---|---|---|---|---|
| 5,410,490 A | * | 4/1995 | Yastrow | 716/5 |
| 5,598,348 A | * | 1/1997 | Rusu et al. | 716/2 |
| 5,798,937 A | * | 8/1998 | Bracha et al. | 716/9 |
| 6,272,668 B1 | * | 8/2001 | Teene | 716/10 |
| 6,321,371 B1 | * | 11/2001 | Yount, Jr. | 716/17 |
| 6,446,248 B1 | * | 9/2002 | Solomon et al. | 716/17 |
| 6,546,538 B1 | * | 4/2003 | Rubdi et al. | 716/12 |
| 6,668,365 B2 | * | 12/2003 | Harn | 716/10 |
| 6,684,377 B2 | * | 1/2004 | Barney et al. | 716/10 |
| 6,845,491 B2 | * | 1/2005 | Miller et al. | 716/1 |
| 6,877,144 B1 | * | 4/2005 | Rittman et al. | 716/10 |
| 2002/0112212 A1 | * | 8/2002 | Cohn et al. | 716/1 |
| 2003/0229875 A1 | * | 12/2003 | Smith et al. | 716/10 |
| 2004/0139412 A1 | * | 7/2004 | Ito et al. | 716/8 |

FOREIGN PATENT DOCUMENTS

| JP | 2001-189384 | 7/2001 |
|---|---|---|
| JP | 2001-351985 | 12/2001 |

* cited by examiner

Primary Examiner—A. M. Thompson
Assistant Examiner—Nghia M. Doan
(74) Attorney, Agent, or Firm—Buchanan Ingersoll PC

(57) ABSTRACT

A redundancy detection unit refers to layout data stored in a data storage unit and reflecting completed automatic placement and routing to detect a redundant region in a region having a cell arranged therein. An automatic insertion unit inserts in the detected redundant region a capacitive cell having a capacitive component and free of logic. As such a voltage drop can be reduced in a region scarce of LSI wiring resources. Furthermore, increased wiring capacitance can be provided without increased LSI chip area.

11 Claims, 28 Drawing Sheets

FIG.6A
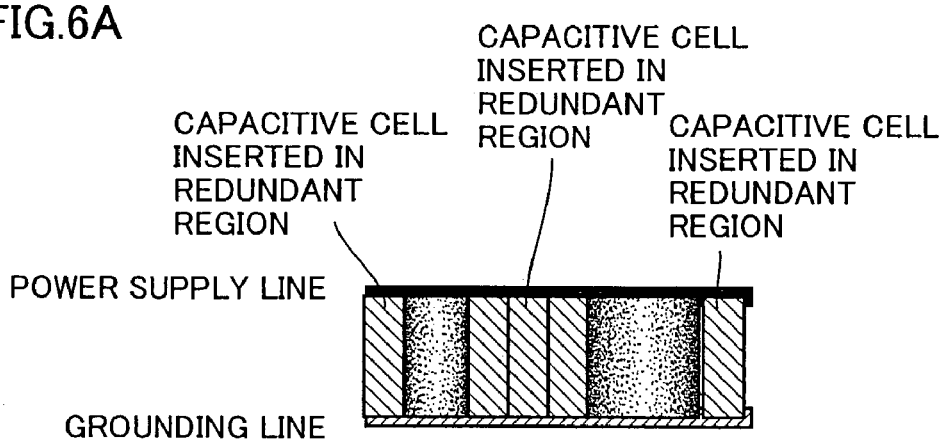
FIG.6B
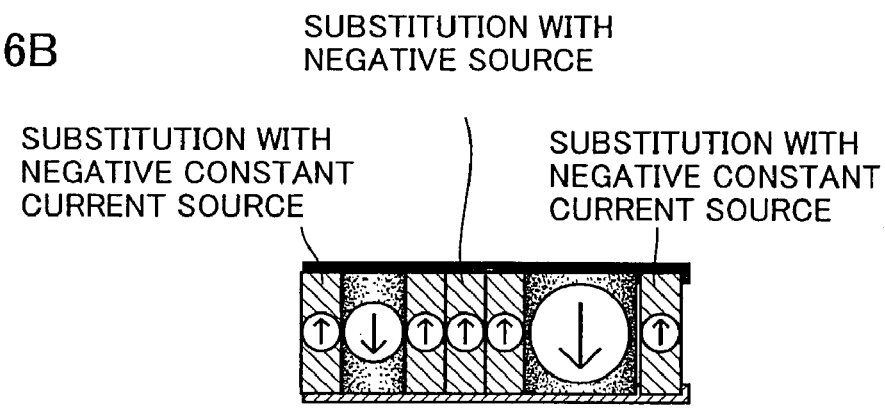
FIG.7
```
INST_PWR_L1{
  NAME"Cap1";
  VDD_CURRENT-7.128e-06;
  GND_CURRENT-7.128e-06;
# cell's bBox(228445,-313320)(228725,-314160)
}
INST_PWR_L1{
  NAME"Cap2";
  VDD_CURRENT-7.128e-06;
  GND_CURRENT-7.128e-06;
# cell's bBox(310135,-341880)(310415,-342720)
}
```

MODULE OF HIGH OPERATION RATE

MEGA CELL

MODULE OF HIGH OPERATION RATE

MEGA CELL

DUMMY CELL WITH REDUNDANT REGION

AUTOMATIC PLACEMENT AND ROUTING APPARATUS AUTOMATICALLY INSERTING A CAPACITIVE CELL

BACKGROUND OF THE INVENTION

1. Field of the Invention

The present invention relates generally to automatic placement and routing techniques used in designing system large scale integrated circuits (LSIs) and particularly to automatic placement and routing apparatuses capable of automatic placement and routing of LSIs to for example allow LSI chips to have small areas and wiring resources to be less consumed, and reduce an effect attributed to voltage drop.

2. Description of the Background Art

In recent years, as LSI has been increasingly highly integrated, voltage drop has increasingly contributed to disadvantageously impaired performance of semiconductor device. This impaired performance can be improved by inserting a capacitive cell under a main power supply line to increase the line's wiring capacitance.

This capacitive cell, however, is inserted under the main power supply line manually after a layout design has been completed. This results in an LSI chip from having a disadvantageously increased area.

Furthermore, it depends on the designer's experiences and guesswork how many capacitive cells should be inserted. As such it has been difficult to determine an optimal number of capacitive cells to be inserted and their optimal positions for insertion.

SUMMARY OF THE INVENTION

The present invention contemplates an automatic placement and routing apparatus capable of automatic placement and routing to reduce a voltage drop in a region of an LSI that is scarce of wiring resources.

The present invention also contemplates an automatic placement and routing apparatus capable of automatic placement and routing to provide an increased wiring capacitance without an increased area of an LSI chip.

The present invention also contemplates an automatic placement and routing apparatus capable of automatic placement and routing to stabilize power supply voltage and prevent a negative effect attributed to noise of power supply, ground and the like.

In one aspect of the present invention an automatic placement and routing apparatus includes: a redundancy detection unit referring to layout data reflecting completed automatic placement and routing to detect a redundant region in a cell placement region having a cell arranged therein; and a cell insertion unit inserting in the redundant region detected by the redundancy detection unit a capacitive cell having a capacitive component and free of logic.

The cell insertion unit inserts a capacitive cell in a redundant region detected by the redundancy detection unit. As such, a voltage drop can be reduced in a region of an LSI that is scarce of wiring resources. Furthermore, without an increased area of the LSI chip an increased wiring capacitance can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

In the drawings:

FIGS. 6A and 6B illustrate that a capacitive cell inserted in a redundant region is being defined as a negative, constant current source;

FIG. 7 shows one example of a current consumption value report file output by current consumption value output unit 29;

DESCRIPTION OF THE PREFERRED EMBODIMENTS

First Embodiment

Figure 1:
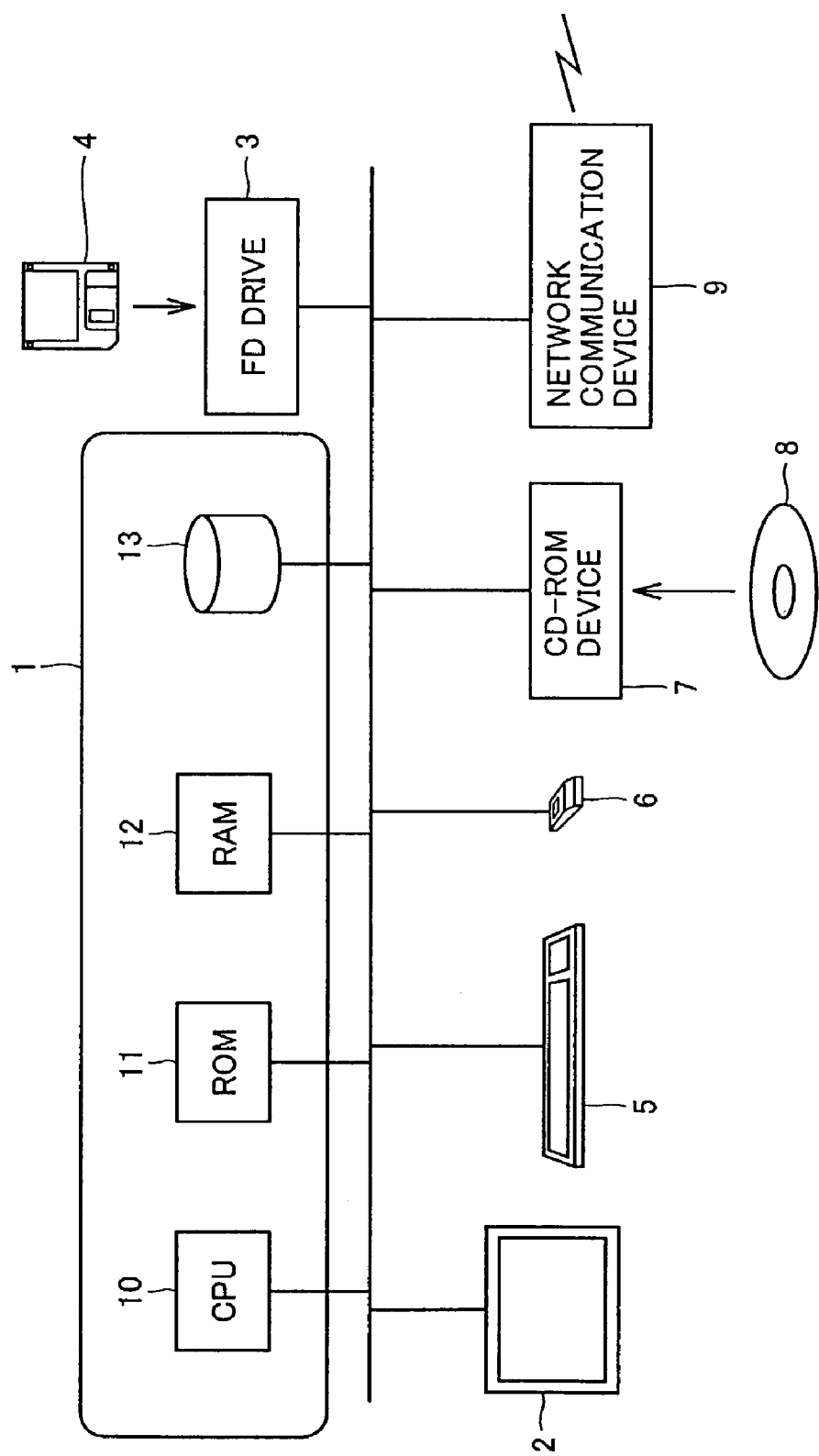
FIG. 1 is a block diagram illustrating a configuration of an automatic placement and routing apparatus of a first embodiment of the present invention.

FIG. 1 illustrates a configuration of an automatic placement and routing apparatus of a first embodiment of the present invention. The apparatus includes a body of a computer 1, a display device 2, a flexible disk (FD) drive 3 to which an FD 4 is mounted, a keyboard 5, a mouse 6, a compact disc-read only memory (CD-ROM) device 7 to which a CD-ROM 8 is mounted, and a network communication device 9.

The automatic placement and routing apparatus is implemented by a program (hereinafter referred to as an "automatic placement and routing program") supplied via FD4, CD-ROM 8 or other similar recording medium. The program is executed by the body of the computer 1 to automatically arrange and route an LSI. Alternatively, the program may be supplied from another computer to the body of the computer 1 via network communication device 9.

The body of the computer 1 includes central processing unit (CPU) 10, a read only memory (ROM) 11, a random access memory (RAM) 12 and a hard disc 13. CPU 10 provides a processing while communicating data with display device 2, FD drive 3, keyboard 5, mouse 6, CD-ROM device 7, network communication device 9, ROM 11, RAM 12 or hard disc 13. The automatic placement and routing program recorded on FD 4 or CD-ROM 8 is temporarily stored by CPU 10 to hard disc 13 via FD drive 3 or CD-ROM device 7. CPU 10 loads the program from hard disc 13 to RAM 12 and executes it, as appropriate, to automatically arrange and route the LSI.

Figure 2A:
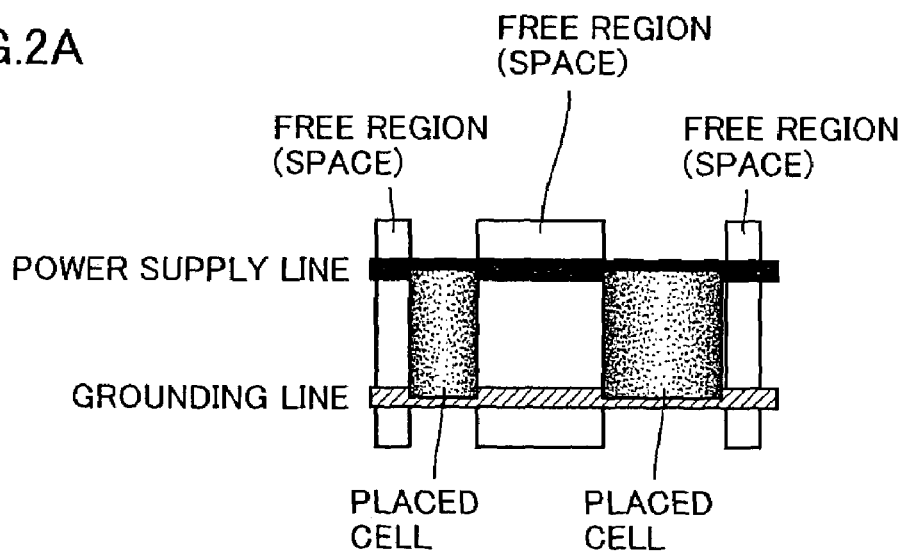
FIGS. 2A–2C are views for illustrating a method performed by the apparatus of the first embodiment to insert a capacitive cell between placed cells.
Figure 2B:
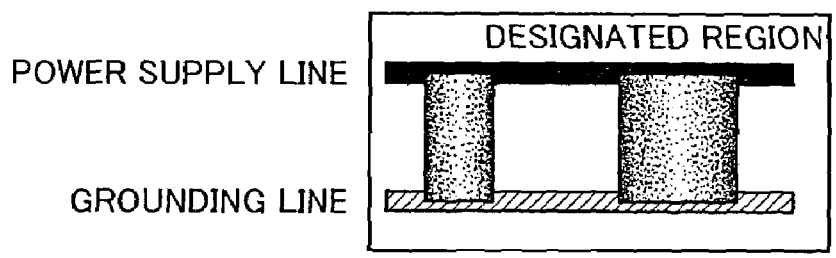
Figure 2C:
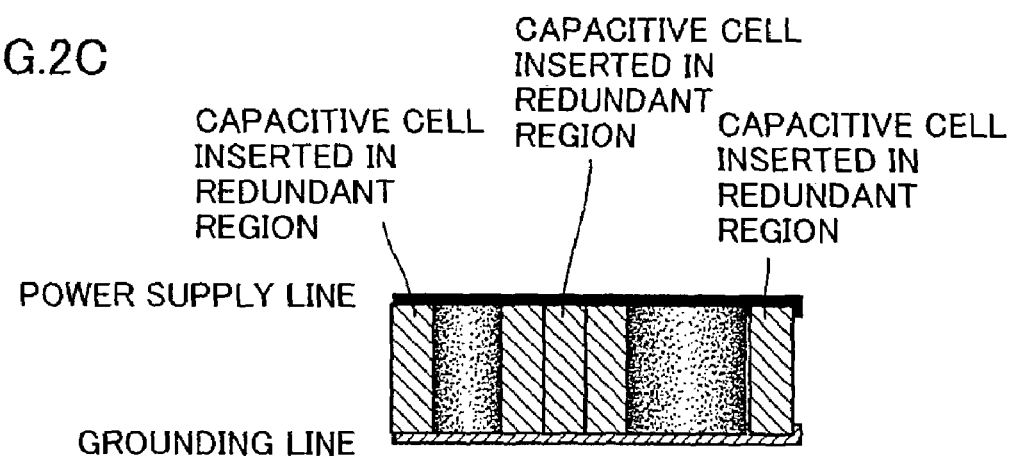

FIG. 2A shows a cell arranged between a power supply line and a grounding line (hereinafter simply referred to as an "placed cell"). As shown in FIG. 2A, between placed cells there exists a redundant portion (hereinafter referred to as a "free region" or a "redundant region") at a ratio. In the first embodiment the automatic placement and routing apparatus automatically detects a free region between placed cells and inserts a capacitive cell in the free region. FIGS. 2B and 2C will be described later.

Figure 3:
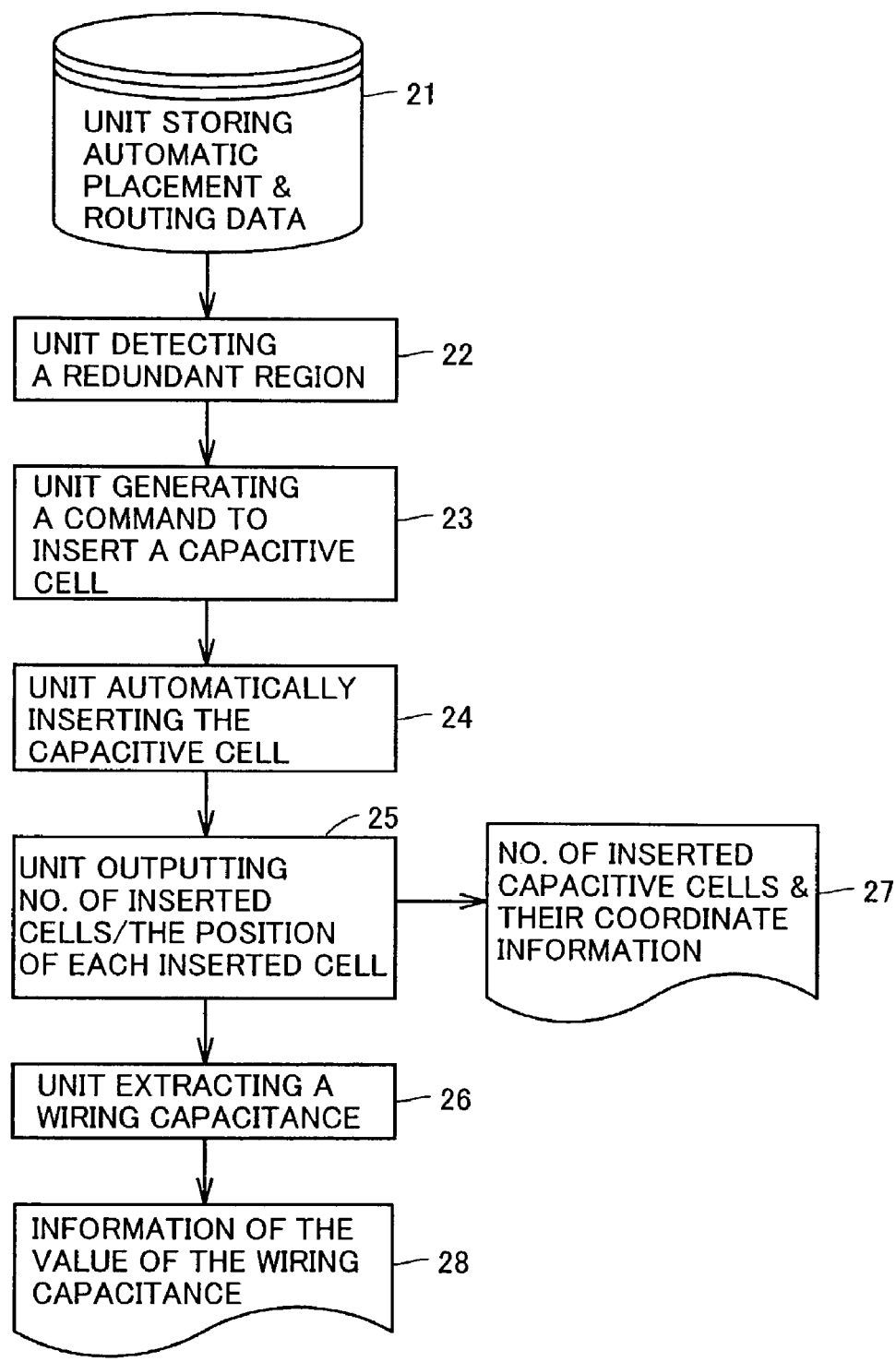
FIG. 3 is a block diagram representing a functional configuration of the apparatus of the first embodiment.

FIG. 3 is a block diagram illustrating a functional configuration of the automatic placement and routing apparatus of the first embodiment. The apparatus includes: a data storage unit 21 storing automatic placement and routing data generated by an automatic placement and routing tool (or layout data reflecting completed automatic placement and routing); a redundancy detection unit 22 referring to the data in data storage unit 21 to automatically detect a space (or free region) in a designated region; a command generation unit 23 generating a command to automatically insert a capacitive cell in the free region detected by redundancy detection unit 22; an automatic cell insertion unit 24 executing the command to automatically insert the capacitive cell; a number/position output unit 25 outputting the number of capacitive cells inserted by automatic cell insertion unit 24 and the positions at which the capacitive cells are inserted; and an extraction unit 26 receiving from number/position output unit 25 referring to the output number of inserted capacitive cells and their positions to extract a power supply line's wiring capacitance and output it as wiring-capacitance value information 28.

Figure 4:
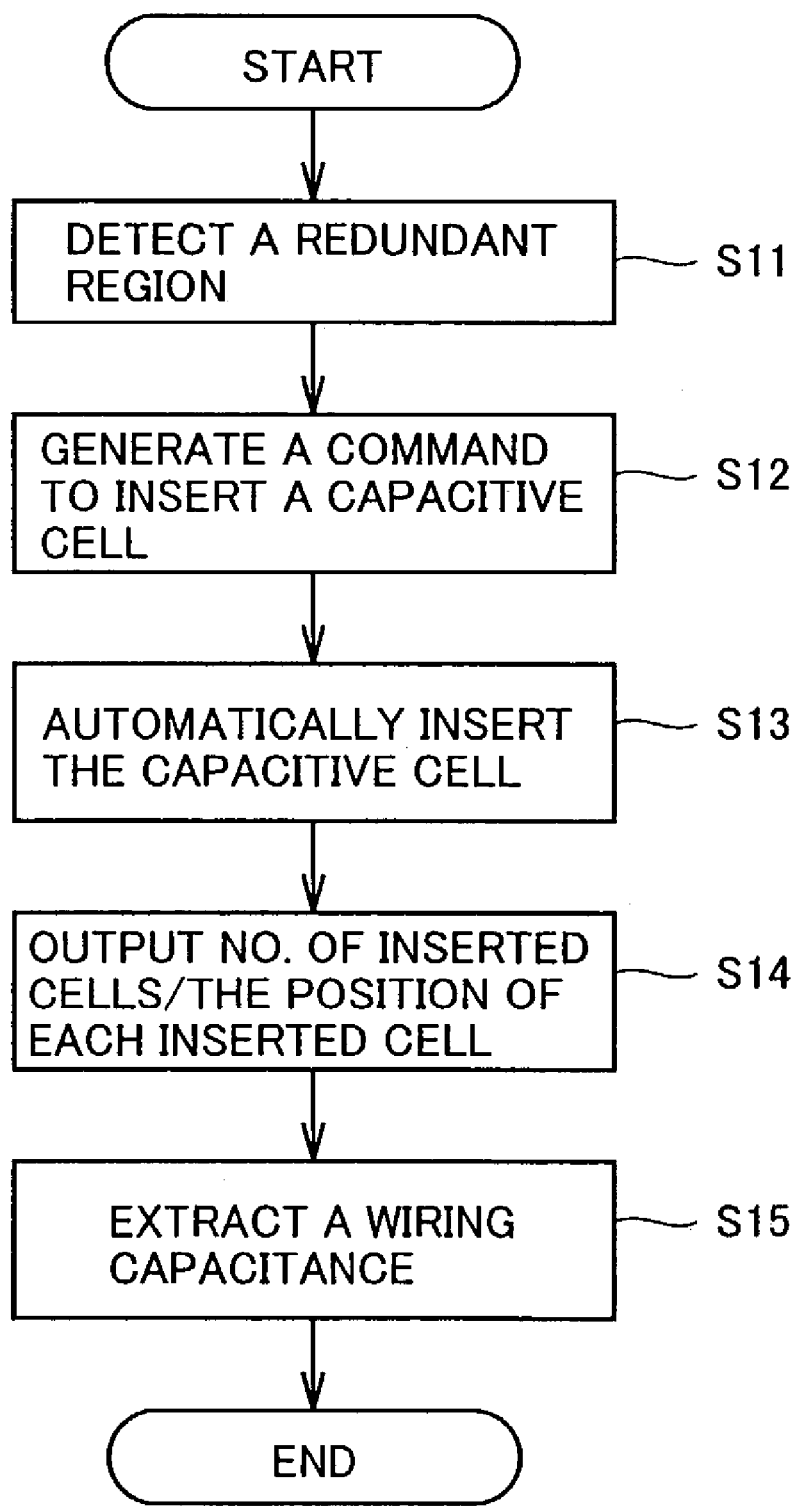
FIG. 4 is a flowchart for illustrating a procedure of a process performed by the apparatus of the first embodiment.

FIG. 4 is a flowchart for illustrating a procedure of a process performed by the automatic placement and routing apparatus of the first embodiment. Initially, redundancy detection unit 22 automatically detects a free region in a region designated by a user (S11).

FIG. 2B shows one example of a region designated by a user. Redundancy detection unit 22 detects a free region (see FIG. 2A) in a designated region shown in FIG. 2B and outputs a result of the detection to command generation unit 23.

Command generation unit 23 then generates a command to insert a capacitive cell into the free region such that the capacitive cell does not overlap any placed cell (S12). Note that the capacitive cell inserted is a previously prepared cell that does not have logic and only has a capacitive component.

Automatic cell insertion unit 24 then executes the command to insert the capacitive cell in the free region (S13). Steps S11–S13 are repeated whenever a user designates a region.

Note that the automatic placement and routing tool has a function detecting a space in a designated region and inserting a cell corresponding to the space. Steps S11–S13 are performed using this function.

Number/position output unit 25 then refers to an execution log file or an placement information file, which is output from the automatic placement and routing tool, to extract and output a total number of inserted capacitive cells and the positions at which the capacitive cells have been inserted (a number of inserted capacitive cells and their coordinate positions 27) (S14). The execution log file or placement information file output from the tool has information of all of placed cells and their positional information recorded therein. By extracting only information of capacitive cells, the number of inserted capacitive cells and their coordinate positions 27 can be generated.

Finally, extraction unit 26 refers to the output number of inserted capacitive cells and their positions to extract a power supply line's wiring capacitance and output it as wiring-capacitance value information 28 (S15).

Thus in the present embodiment the automatic placement and routing apparatus can automatically detect a free region between placed cells and automatically insert a capacitive cell in the detected free region. This can reduce a voltage drop in a region scarce of wiring resources and also provide an increased wiring capacitance without an increased area of an LSI chip.

Furthermore, number/position output unit 25 that outputs the number of automatically inserted capacitive cells and their coordinate information can help to confirm capacitive cells inserted in laying out.

Second Embodiment

The present invention in a second embodiment provides an automatic placement and routing apparatus configured, by way of example, to be similar to that described in the first embodiment with reference to FIG. 1. Accordingly, like placements and functions will not be described in detail.

Figure 5:
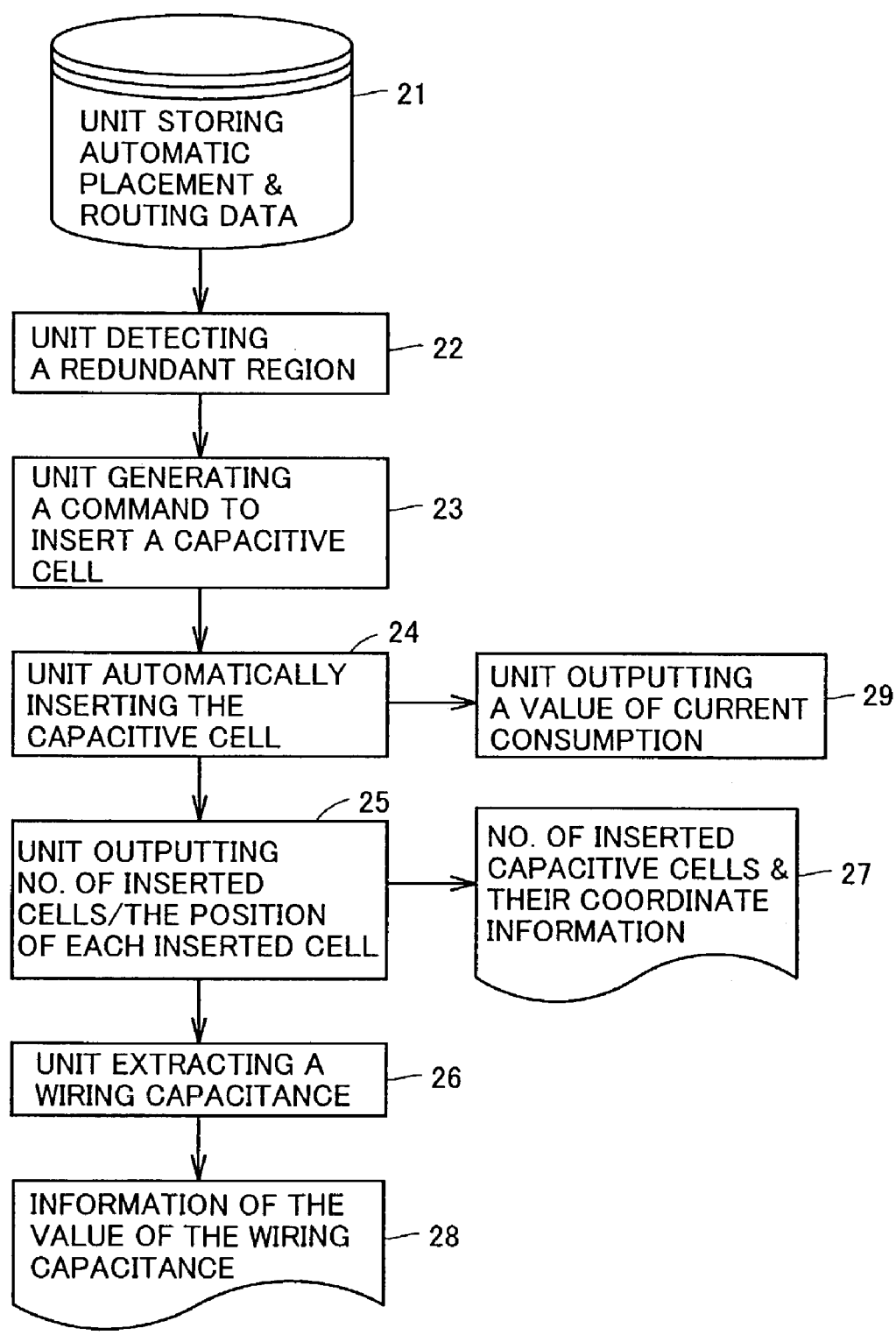
FIG. 5 is a block diagram illustrating a functional configuration of an automatic placement and routing apparatus of a second embodiment of the present invention.

FIG. 5 is a block diagram showing a functional configuration of the automatic placement and routing apparatus of the second embodiment. It differs from the apparatus of the first embodiment shown in FIG. 3 only in that a current consumption value output unit 29 is added. Accordingly, like placements and functions will not be described in detail.

Current consumption value output unit 29 defines a capacitive cell inserted in a free region and only having a capacitive component, as a negative constant current source having a value of a current defined by the following equation:

$$I = -K \times C \times V \times f \times \alpha \qquad (1),$$

wherein I represents a value of a current of the capacitive cell, K represents a correction factor, C represents a value of a capacitance of the capacitive cell, V represents a power supply voltage, f represents an LSI's operating frequency, and $\alpha$ represents a probability of switching of adjacent placed cells.

FIGS. 6A and 6B show that a capacitive cell inserted in a redundant region is being defined as a negative constant current source. For example, if capacitive cells are inserted, as shown in FIG. 6A, each capacitive cell is defined as a negative constant current source, as shown in FIG. 6B. Note that each capacitive cell's capacitance is determined when the cell is inserted in a redundant region.

A power consumption analysis and a voltage drop analysis are performed with each logic cell assumed as a constant current source consuming a predetermined current. When current consumption value output unit 29 reports the value of a current consumed by each instance, output unit 29 writes in a report file the value of a current consumed by a logic cell as well as that of a current consumed by a capacitive cell defined as a negative constant current source and outputs the report file. This report file is based on to perform the power consumption and voltage drop analyses.

FIG. 7 shows one example of a current consumption value report file output from current consumption value output unit 29. In this report file on the first to sixth lines a capacitive cell having an instance name "Cap1" provides a current consumption value, as defined after "VDD_CURRENT" and "GND_CURRENT", and its coordinate information is defined after "cel's bBOX". Similarly, the report file on the 7th to 12th lines provides a definition of a current consumption value of a capacitive cell having an instance name "Cap2" and that of the cell's coordinate information.

Thus in the automatic placement and routing apparatus of the present embodiment current consumption value output unit 29 can write in a report file the value of a current consumed by a capacitive cell defined as a negative constant current source and outputs the report file. As such in addition to the effect described in the first embodiment a power consumption analysis or a voltage drop analysis can be provided accurately.

Third Embodiment

The present invention in a third embodiment provides an automatic placement and routing apparatus having a configuration, by way of example, similar to that of the apparatus of the first embodiment shown in FIG. 1. Accordingly, like placements and functions will not be described in detail.

Figure 8A:
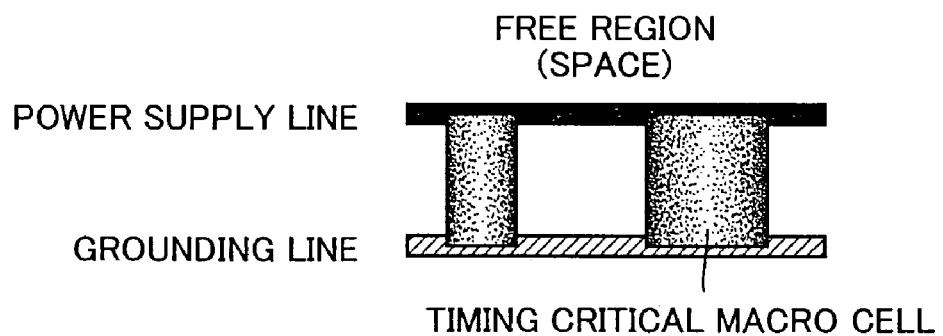
FIGS. 8A and 8B are diagrams for illustrating a macro cell into which an automatic placement and routing apparatus of a third embodiment of the present invention inserts a capacitive cell.
Figure 8B:
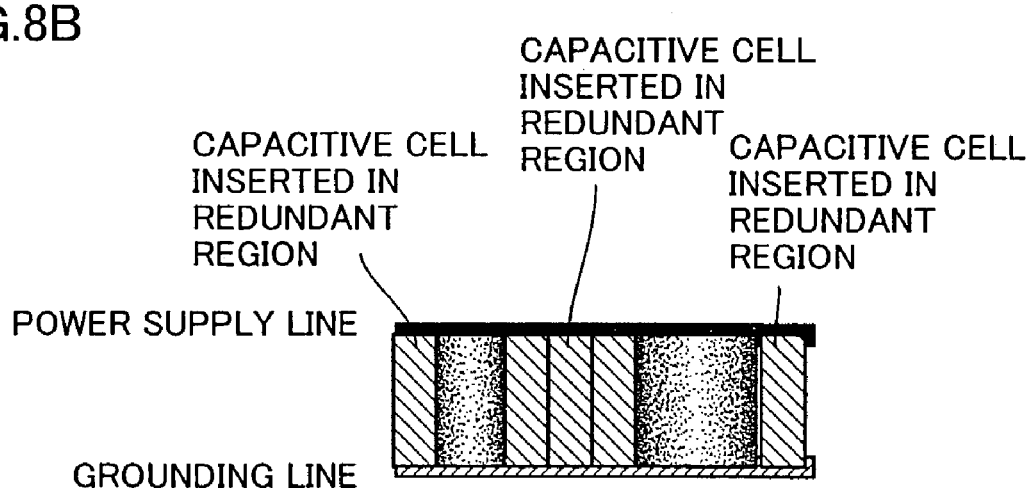

FIG. 8A is a view for illustrating a macro cell in which the automatic placement and routing apparatus of the third embodiment inserts a capacitive cell in a free region existing in a vicinity of a macro cell with a voltage drop value exceeding a reference value (or a timing critical macro cell). FIG. 8B shows that a capacitive cell has been inserted in a vicinity of a timing critical macro cell.

Figure 9:
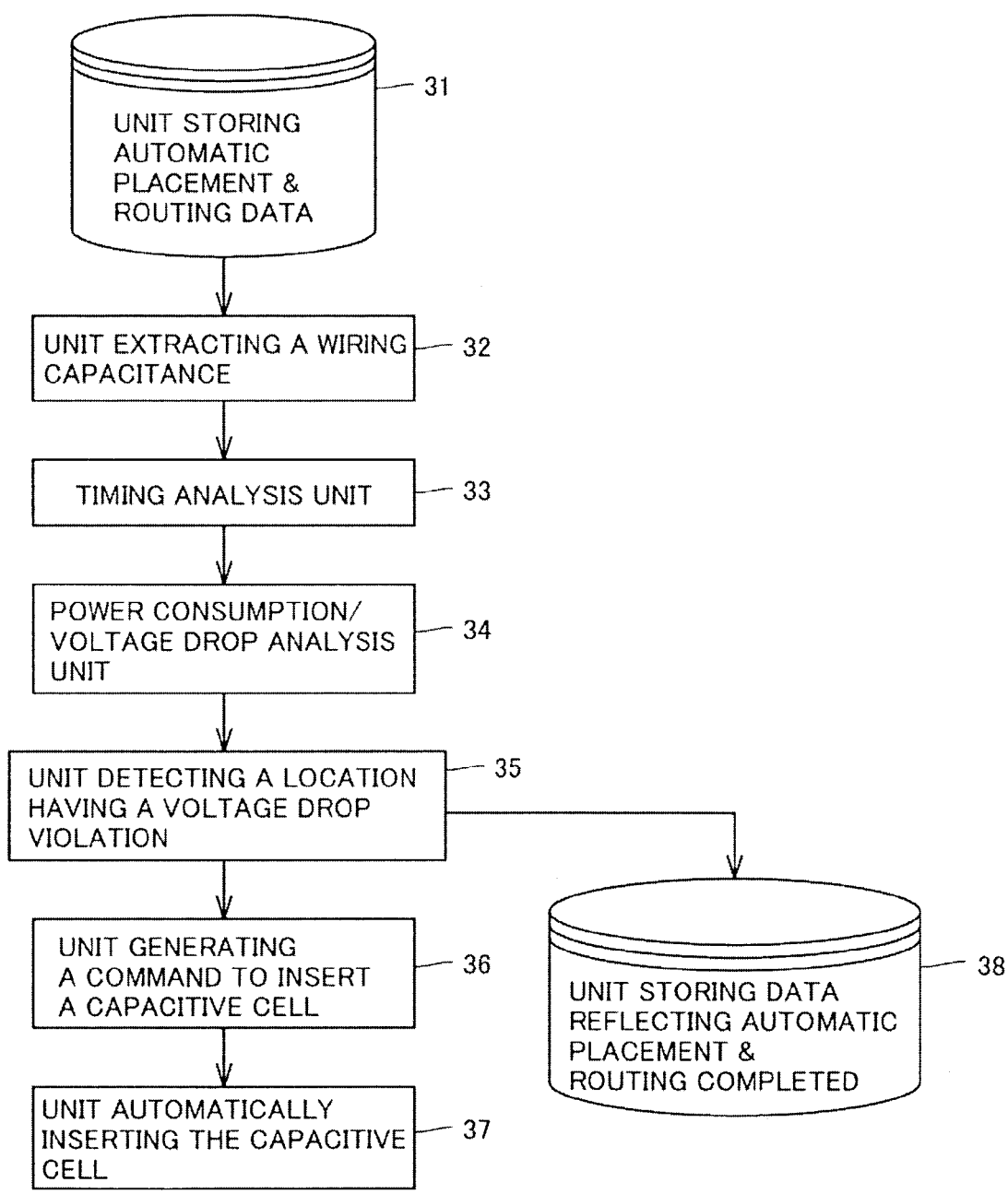
FIG. 9 is a block diagram illustrating a functional configuration of the apparatus of the third embodiment.

FIG. 9 is a block diagram showing a functional configuration of the automatic placement and routing apparatus of the third embodiment. The apparatus includes a data storage unit 31 storing automatic placement and routing data generated by an automatic placement and routing tool, an extraction unit 32 referring the data in data storage unit 31 to extract a wiring capacitance of a power supply line connected to an placed cell, a timing analysis unit 33 referring to the data in data storage unit 31 and a test pattern (not shown) to perform a timing analysis of each placed cell, a power consumption/voltage drop analysis unit 34 performing a power consumption analysis and a voltage drop analysis using the wiring capacitance of the power supply line connected to the placed cell that is extracted by extraction unit 32 and a result of the timing analysis that is provided by timing analysis unit 33, a detection unit 35 referring to a result of the analysis by power consumption/voltage drop analysis unit 34 to detect a location having a voltage drop exceeding a reference value (hereinafter referred to as a "voltage drop violation"), a command generation unit 36 generating a command to automatically insert a capacitive cell in a free region in a vicinity of an placed cell having a voltage drop violation, an automatic cell insertion unit 37 executing the command to automatically insert the capacitive cell, and a data storage unit 38 storing automatic placement and routing data reflecting that the capacitive cell has been inserted.

Figure 10:
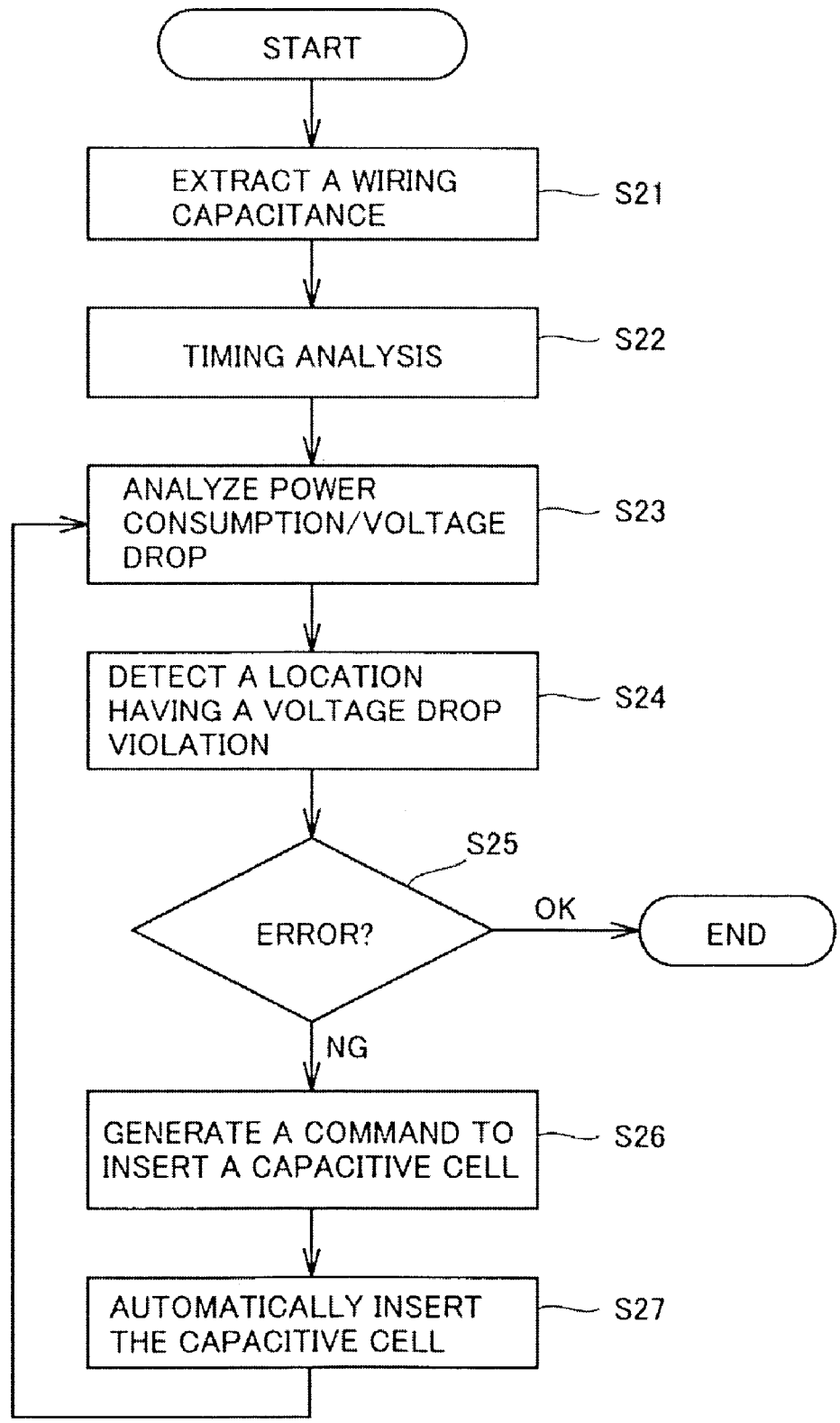
FIG. 10 is a flowchart for illustrating a procedure of a process performed by the apparatus of the third embodiment.

FIG. 10 is a flowchart for illustrating a procedure of a process performed by the automatic placement and routing apparatus of the third embodiment. Initially, extraction unit 32 refers to data storage unit 31 to extract a wiring capacitance of a power supply line connected to each placed cell (S21).

Timing analysis unit 33 then uses the automatic placement and routing data in data storage unit 31 and a test pattern (not shown) to perform a timing analysis of each placed cell (S22).

Power consumption/voltage drop analysis unit 34 then performs a power consumption analysis and a voltage drop analysis with reference to the capacitance of the power supply line connected to the placed cell that is extracted by extraction unit 32 and a result of the timing analysis performed by timing analysis unit 33, and analysis unit 34 outputs a result of the analysis to detection unit 35 (S23).

Detection unit 35 receives the result of the analysis from power consumption/voltage drop analysis unit 34 and refers to the same to detect a location having a voltage drop violation (S24). If there does not exists a voltage drop violation (OK at S25), the current automatic placement and routing data is stored to data storage unit 38 to complete the process.

If any voltage drop violation exists (NG at S25) then command generation unit 36 sets a region containing the region having the voltage drop violation and generates a command to insert a capacitive cell in the set region at a free region such that the capacitive cell does not overlap any placed cell (S26). Note that the capacitive cell to be inserted is a previously prepared cell that does not have any logic and it only has a capacitive component.

Automatic cell insertion unit 37 then executes the command to automatically insert the capacitive cell in the free region (S27). The process then returns to S23 to examine whether the voltage drop violation has been eliminated.

Thus in the present embodiment the automatic placement and routing apparatus can automatically detect a free region in a vicinity of an placed cell having a voltage drop violation and automatically insert a capacitive cell in the detected free region. This can increase a wiring capacitance of a power supply line having a voltage drop violation and prevent a voltage drop and also prevent an LSI from erroneously operating.

Fourth Embodiment

The present invention in a fourth embodiment provides an automatic placement and routine apparatus having a configuration, by way of example, similar to that of the apparatus of the first embodiment shown in FIG. 1. Accordingly, like placements and functions will not be described in detail.

Figure 11A:
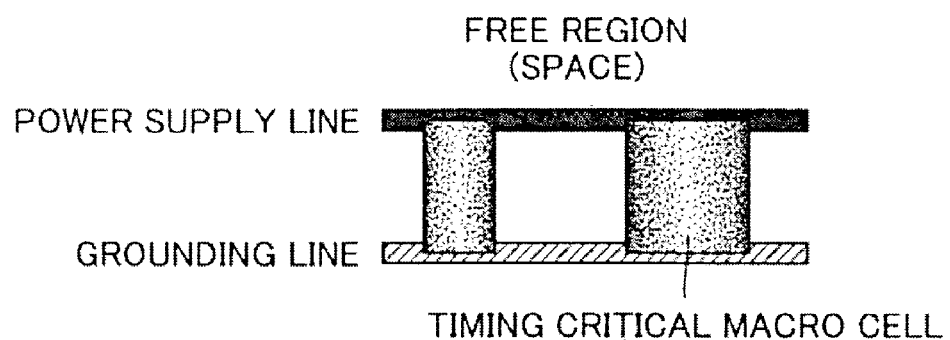
FIGS. 11A and 11B are diagrams for illustrating a macro cell into which an automatic placement and routing apparatus of a fourth embodiment of the present invention inserts a capacitive cell.
Figure 11B:
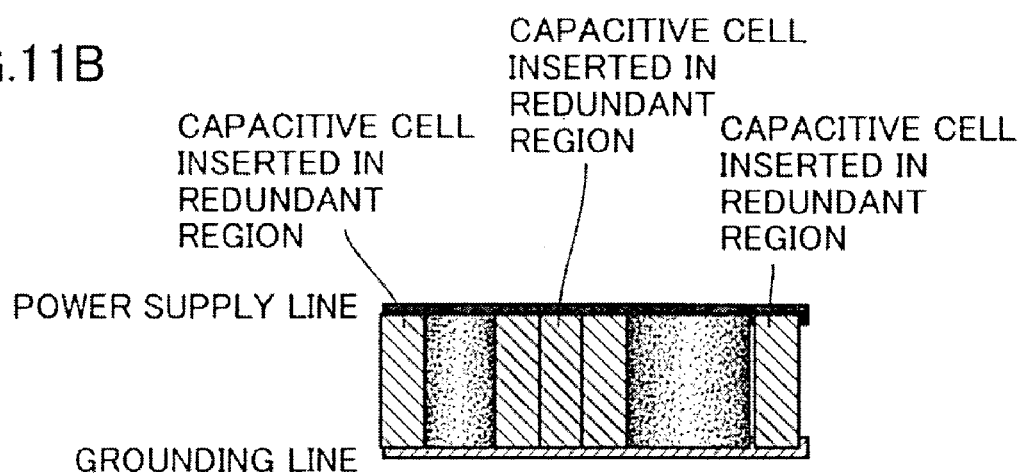

FIG. 11A is a view for illustrating a macro cell in which the apparatus of the fourth embodiments inserts a capacitive cell. The apparatus of the present embodiment performs a timing analysis, detects a path having a timing error or small in timing margin, and inserts a capacitive cell in a free region located in a vicinity of a macro cell, a mega cell or the like connected to the detected path (hereinafter referred to as a "timing critical macro cell"). FIG. 11B shows that a capacitive cell has been inserted in a vicinity of a timing critical macro cell.

Figure 12:
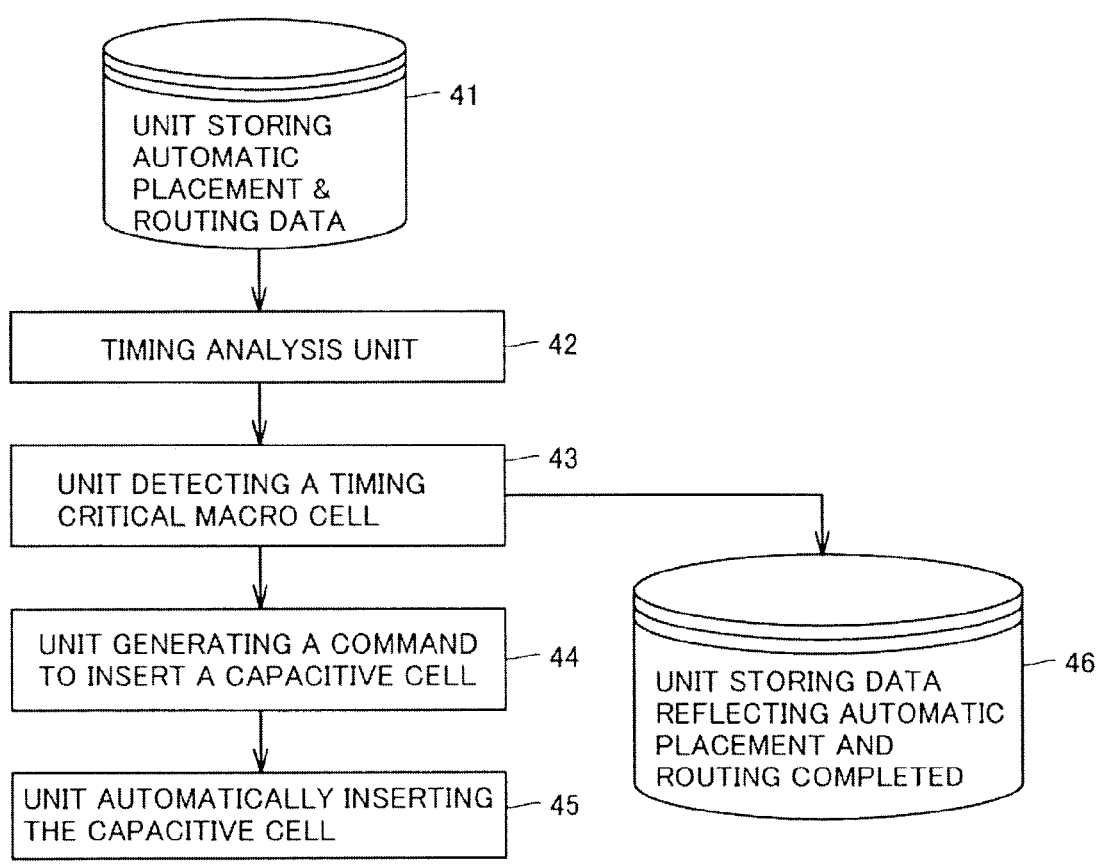
FIG. 12 is a block diagram illustrating a functional configuration of the apparatus of the fourth embodiment.

FIG. 12 is a block diagram showing a functional configuration of the automatic placement and routing apparatus of the fourth embodiment. The apparatus includes a data storage unit 41 storing automatic placement and routing data generated by an automatic placement and routing tool, a timing analysis unit 42 performing a timing analysis using the data stored in data storage unit 41 and a test pattern (not shown), a detection unit 43 referring to a result of the timing analysis to detect a timing critical macro cell, a command generation unit 44 generating a command to automatically insert a capacitive cell in a free region located in a vicinity of the timing critical macro cell, an automatic cell insertion unit 45 executing the command to automatically insert the capacitive cell, and a data storage unit 44 storing automatic placement and routing data reflecting the inserted capacitive cell.

Figure 13:
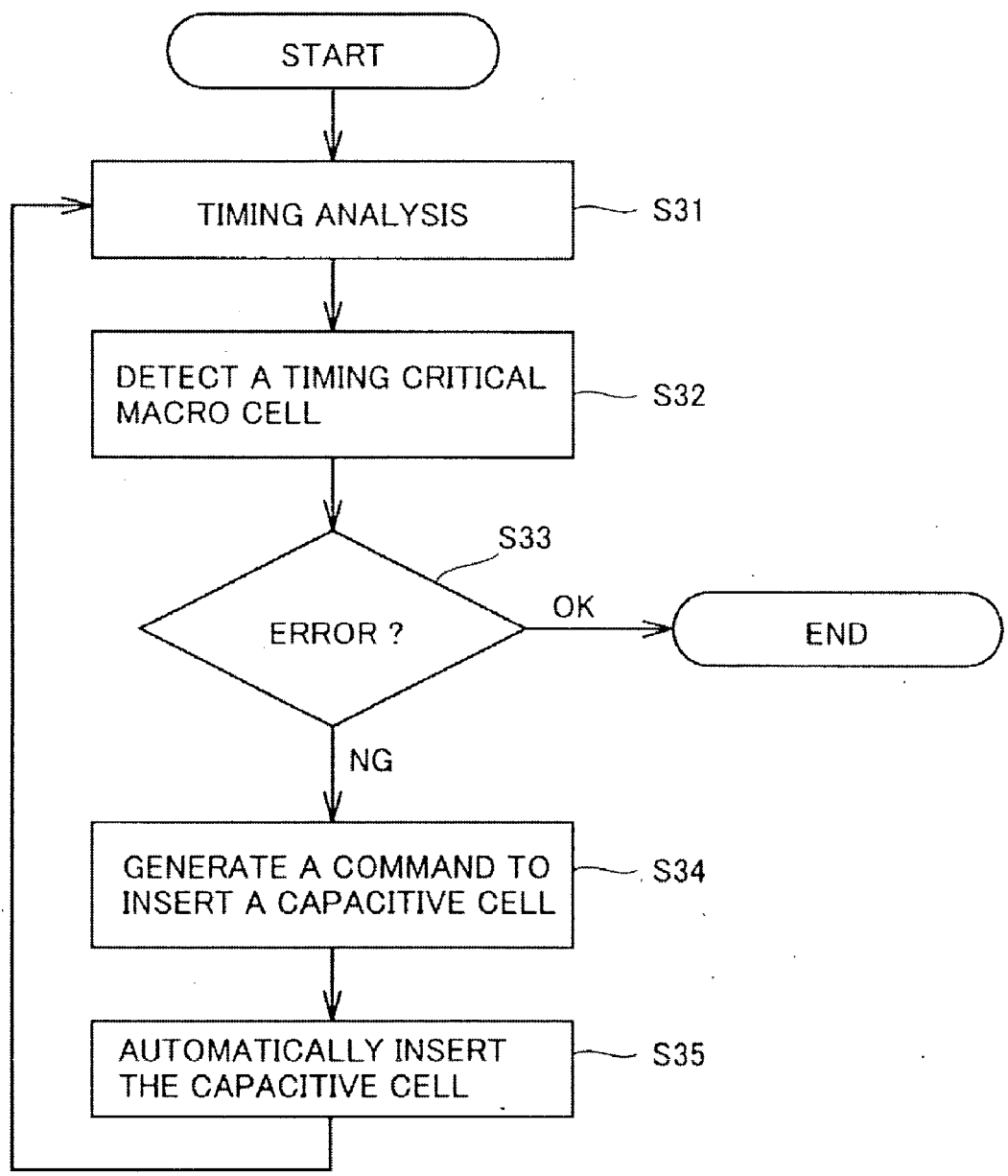
FIG. 13 is a flowchart for illustrating a procedure of a process performed by the apparatus of the fourth embodiment.

FIG. 13 is a flowchart for illustrating a procedure of a process performed by the automatic placement and routing apparatus of the fourth embodiment. Initially, timing analysis unit 42 uses automatic placement and routing data stored in data storage unit 41 and a test pattern (not shown) to perform a timing analysis of each placed cell (S31).

Detection unit 43 refers to a result of the timing analysis to detect a timing critical macro cell (S32). If any timing critical macro cell is not detected (OK at S33) the current automatic and placement and routing data is stored to data storage unit 46 to complete the process.

If any timing critical macro cell is detected (NG at S33) then command generation unit 44 sets a region containing the timing critical macro cell and generates a command to insert a capacitive cell in the set region at a free region such that the capacitive cell does not overlap any placed cell (S34). Note that the capacitive cell to be inserted is a previously prepared cell that does not have any logic and only has a capacitive component.

Automatic cell insertion unit 45 then executes the command to automatically insert the capacitive cell in the free region (S35). The process then returns to S31 to examine whether the timing margin of interest has been improved.

Figure 14A:
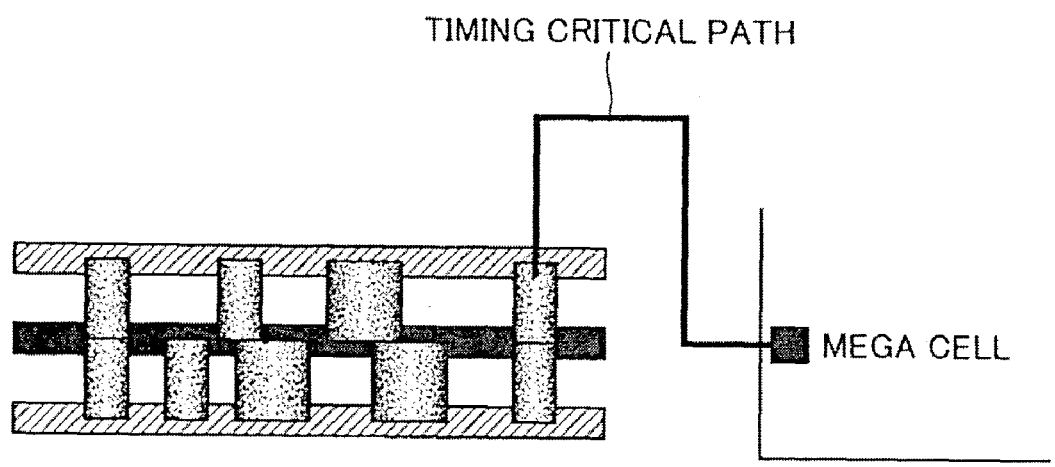
FIGS. 14A and 14B show a capacitive cell being inserted in a vicinity of a detected timing critical macro cell.
Figure 14B:
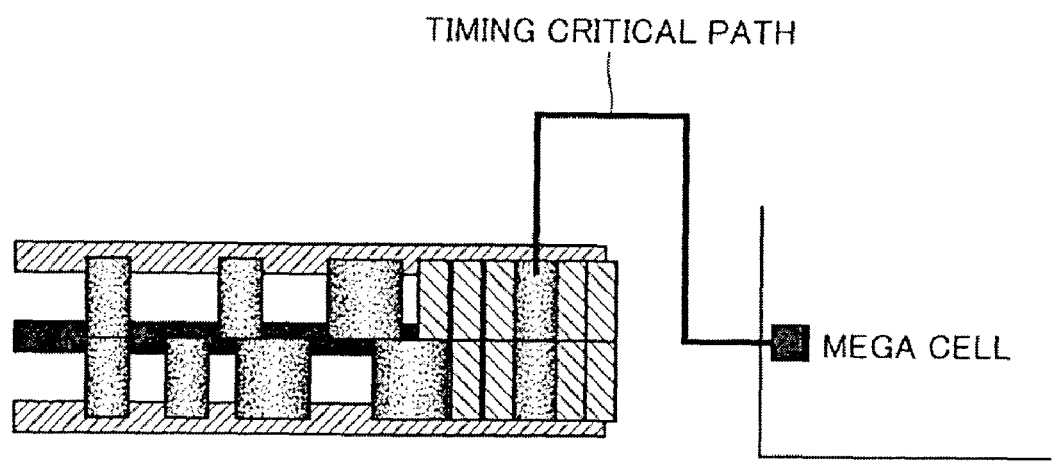

FIGS. 14A and 14B show a capacitive cell being inserted in a vicinity of a detected timing critical macro cell. As shown in FIG. 14A, detection unit 43 detects a macro cell connected to a timing critical path detected by timing analysis unit 42, i.e., a timing critical macro cell. Then, as shown in FIG. 14B, automatic cell insertion unit 45 inserts a capacitive cell in a vicinity of the timing critical macro cell.

Thus in the present embodiment the automatic placement and routing apparatus can detect a free region in a vicinity of a timing critical macro cell and automatically insert a capacitive cell in the detected free region. The timing critical macro cell's power supply line can have an increased wiring capacitance and a power supply voltage that is stabilized allows a timing margin to be improved to prevent an LSI from erroneous operation.

Fifth Embodiment

The present invention in a fifth embodiment provides an automatic placement and routing apparatus having a configuration, by way of example, similar to that of the apparatus of the first embodiment shown in FIG. 1. Accordingly, like placements and functions will not be described in detail.

Figure 15A:
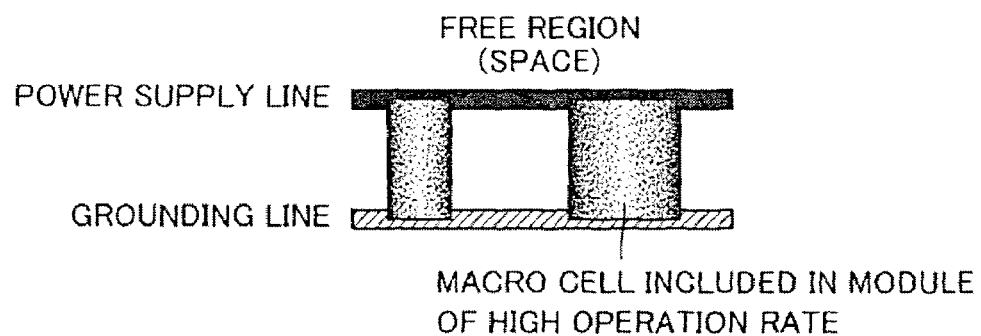
FIGS. 15A and 15B are diagrams for illustrating a macro cell into which an automatic placement and routing apparatus of a fifth embodiment of the present invention inserts a capacitive cell.
Figure 15B:
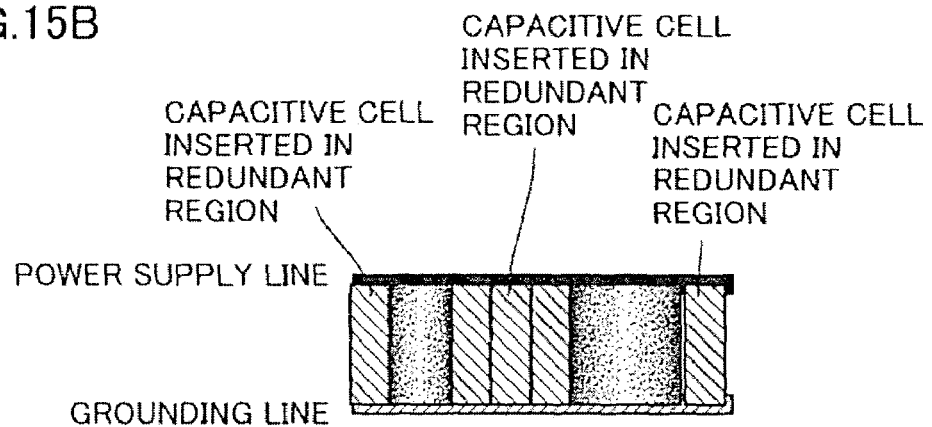

FIG. 15A is a view for illustrating a macro cell in which the apparatus of the fifth embodiment inserts a capacitive cell. The apparatus of the present embodiment effects a simulation and inserts a capacitive cell in a free region located in a vicinity of a macro cell included in a module having a high operation rate (a high probability of transition). FIG. 15B shows that a capacitive cell has been inserted in a vicinity of a macro cell included in a module having a high operation rate.

Figure 16:
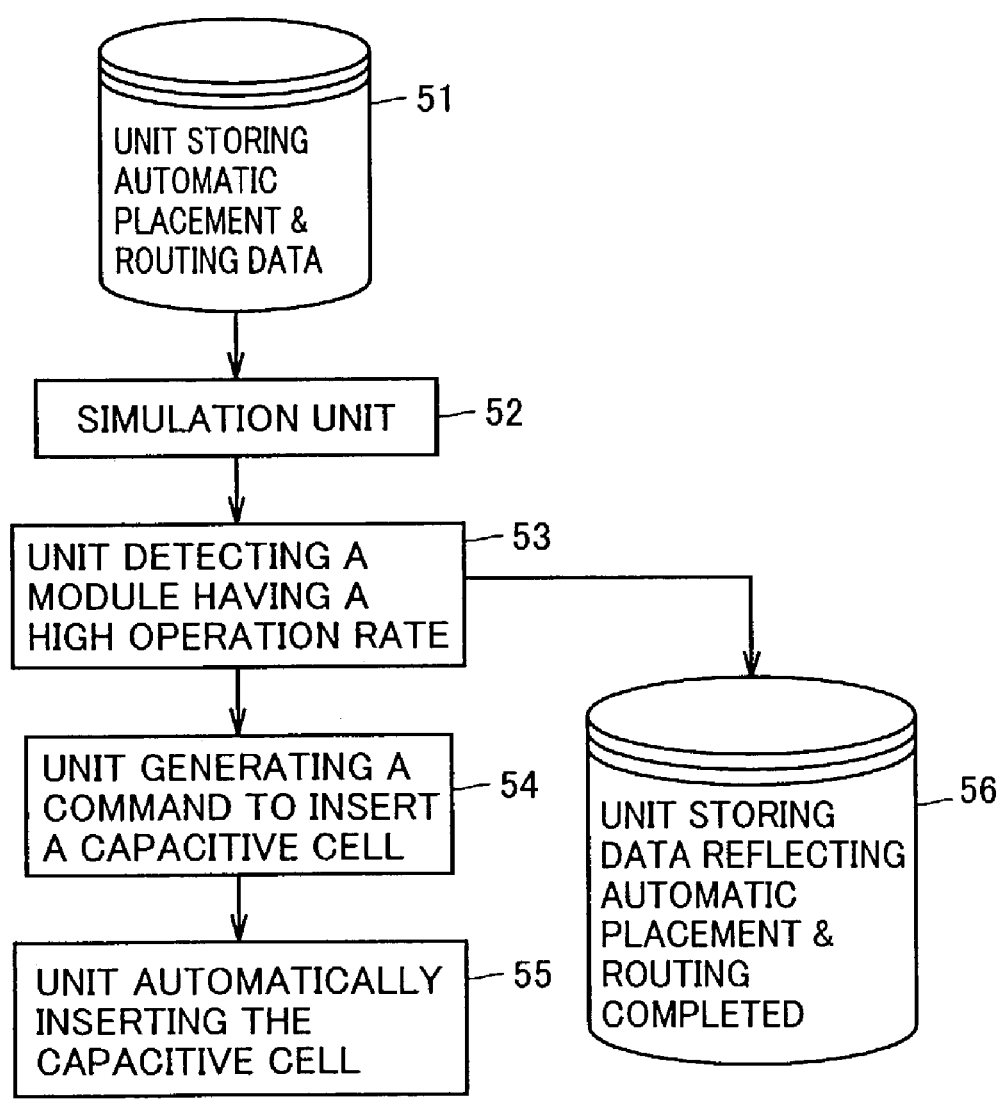
FIG. 16 is a block diagram illustrating a functional configuration of the apparatus of the fifth embodiment.

FIG. 16 is a block diagram showing a functional configuration of the automatic placement and routing apparatus of the fifth embodiment. The apparatus includes a data storage unit 51 storing automatic placement and routing data generated by an automatic placement and routing tool, a simulation unit 52 effecting a simulation using the data stored in data storage unit 51 and a test pattern (not shown), a detection unit 53 referring to a result of the simulation and a netlist information data for automatic placement and routing apparatus to detect a module of a high operation rate to extract a macro cell, a mega cell or the like included in the detected module, a command generation unit 54 generating a command to automatically insert a capacitive cell in a free region located in a vicinity of the extracted macro cell, mega cell or the like, an automatic cell insertion unit 55 executing the command to automatically insert the capacitive cell, and a data storage unit 56 storing automatic placement and routing data reflecting the inserted capacitive cell.

Figure 17:
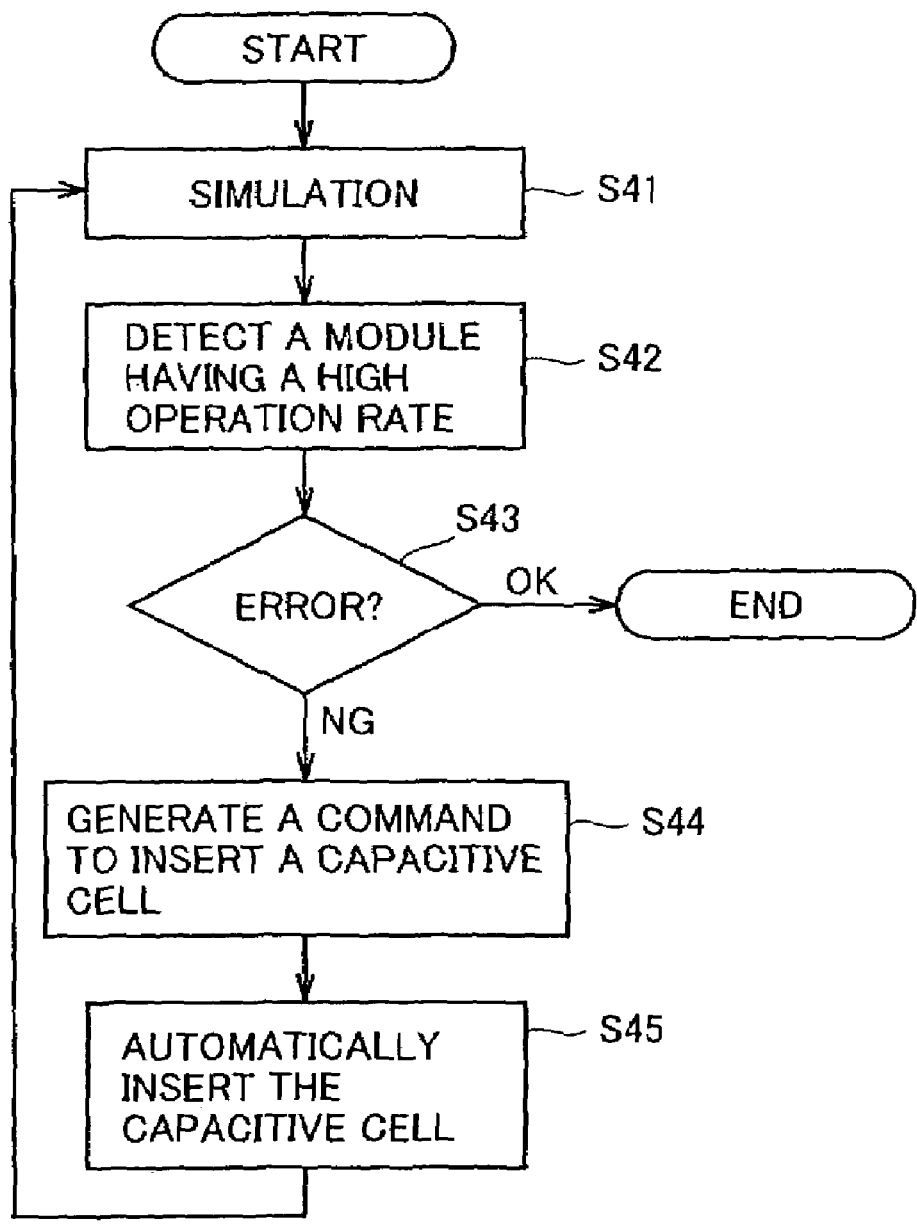
FIG. 17 is a flowchart for illustrating a procedure of a process performed by the apparatus of the fifth embodiment.

FIG. 17 is a flowchart for illustrating a procedure of a process performed by the apparatus of the fifth embodiment. Initially, simulation unit 52 uses automatic placement and routing data stored in data storage unit 51 and a test pattern (not shown) to provide a simulation of each placed cell (S41).

Detection unit 53 refers to a result of the simulation and a netlist information data for automatic placement and routing apparatus to detect a module having a high operation rate (S42). If any module having a high operation rate is not detected (OK at S43) the current automatic and routing data is stored to data storage unit 56 to complete the process.

If any module having a high operation rate is detected (NG at S43) then command generation unit 44 sets a region containing a macro cell or a mega cell included in the detected module and generates a command to insert a capacitive cell in the set region at a free region such that the capacitive cell does not overlap any placed cell (S44). Note that the capacitive cell to be inserted is a previously prepared cell that does not have any logic and only has a capacitive component.

Automatic cell insertion unit 55 then executes the command to automatically insert the capacitive cell in the free region (S45). The process then returns to S41 to repeat the subsequent process.

Figure 18A:
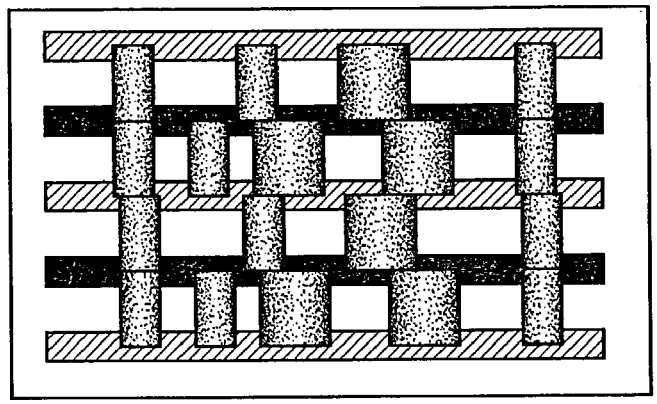
FIGS. 18A and 18B show a capacitive cell being inserted in a vicinity of a macro cell included in a module of a high operation rate that has been detected.
Figure 18A:
Figure 18B:
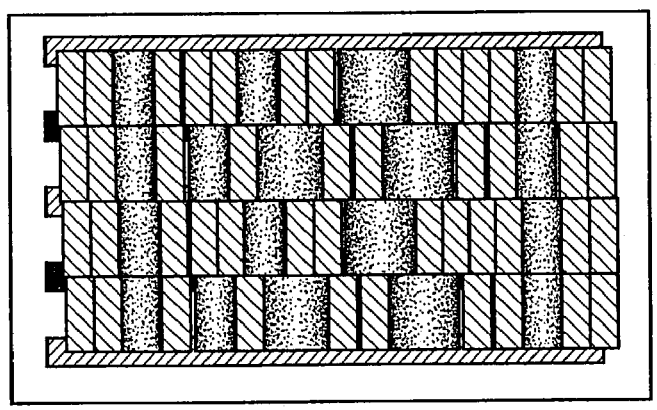
Figure 18B:

FIGS. 18A and 18B show a capacitive cell being inserted in a vicinity of a macro cell included in a detected module having a high operation rate. As shown in FIG. 18A, detection unit 53 refers to a result of a simulation provided by simulation unit 52 to detect a module having a high operation rate. Then, as shown in FIG. 18B, automatic cell insertion unit 55 inserts a capacitive cell in a vicinity of a macro cell included in the detected module.

Thus in the present embodiment the automatic placement and routing apparatus can detect a free region located in a vicinity of a macro cell included in a module having a high operation rate and automatically insert a capacitive cell in the detected free region. The detected module's power supply line can be provided with an increased wiring capacitance and a steady power supply voltage can be provided, and a negative effect of noise of power supply, ground and the like can be prevented.

Sixth Embodiment

The present invention in sixth embodiment provides an automatic placement and routing apparatus having a configuration, by way of example, similar to that of the apparatus of the first embodiment shown in FIG. 1. Furthermore, the apparatus of the sixth embodiment is similar in functional configuration to that of the third, fourth or fifth embodiment shown in FIG. 9, 12 or 16, respectively. Accordingly, like placements and functions will not be described in detail.

Figure 19A:
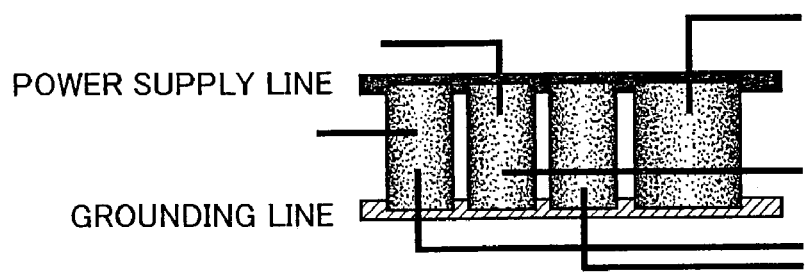
FIGS. 19A and 19B are diagrams for illustrating a macro cell into which an automatic placement and routing apparatus of a sixth embodiment of the present invention inserts a capacitive cell.
Figure 19B:
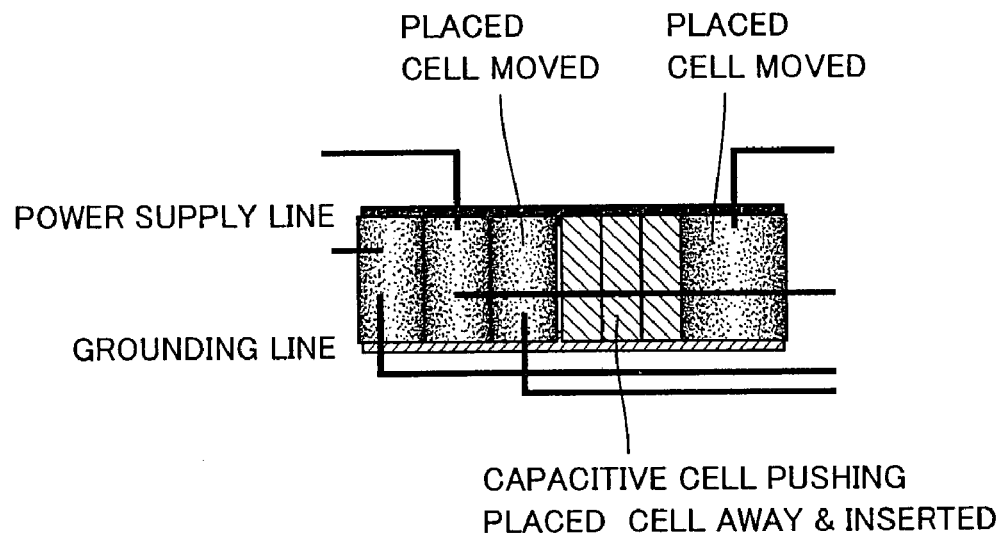

FIGS. 19A and 19B are views for illustrating a macro cell in which the apparatus of the sixth embodiment inserts a capacitive cell. In the third to fifth embodiments, a capacitive cell cannot be inserted if in a vicinity of a placed cell there does not exist a redundant region which can receive the capacitive cell. If there does not exist any redundant region receiving a capacitive cell, as shown in FIG. 19A, the apparatus of the present embodiment can move a placed cell to insert the capacitive cell, as shown in FIG. 19B.

As shown in FIG. 19B, as a placed cell is moved, the moved cell's routing is disconnected or erased and after a capacitive cell has been inserted the disconnected wire is re-routed by automatic placement routing apparatus.

Thus in the present embodiment the automatic placement and routing apparatus can move a placed cell to insert a capacitive cell when there does not exist a redundant region receiving the capacitive cell. In addition to the effects of the third to fifth embodiments it ensures that a capacitive cell is inserted.

Seventh Embodiment

The present invention in a seventh embodiment provides an automatic placement and routing apparatus having a configuration, by way of example, similar to that of the apparatus of the first embodiment shown in FIG. 1. Furthermore, the apparatus of the present embodiment is similar in functional configuration to the apparatus of the third, fourth or fifth embodiment shown in FIG. 9, 12 or 16, respectively. Accordingly, like placements and functions will not be described in detail.

Figure 20A:
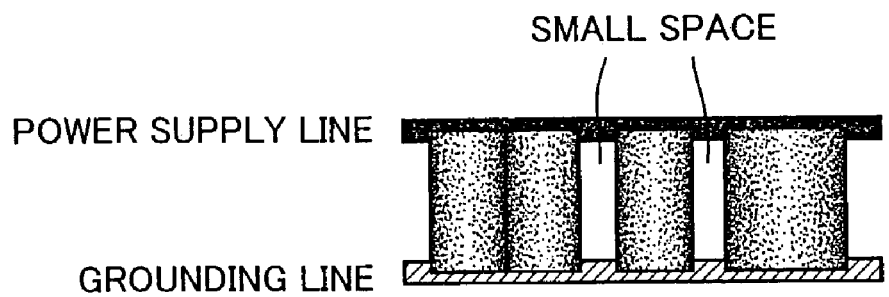
FIGS. 20A and 20B are diagrams for illustrating a macro cell into which an automatic placement and routing apparatus of a seventh embodiment of the present invention inserts a capacitive cell.
Figure 20B:
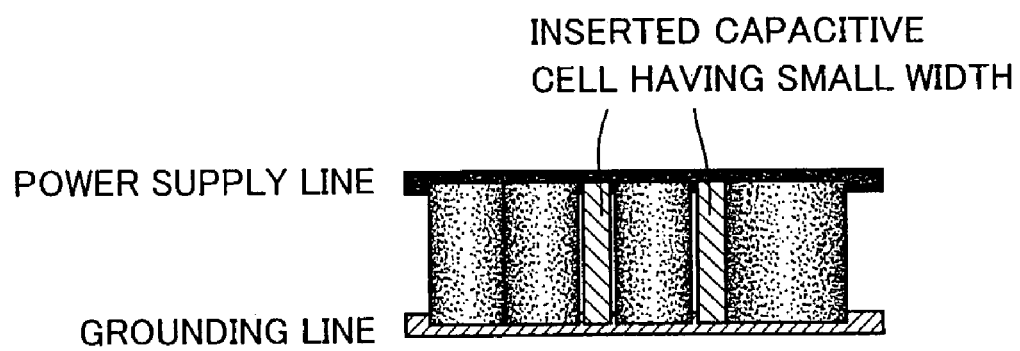

FIGS. 20A and 20B are views for illustrating a macro cell in which the apparatus of the seventh embodiment inserts a capacitive cell. In the third to fifth embodiments, a capacitive cell having a large scale cannot be inserted in a vicinity of an input/output (I/O) cell, a memory cell or any other similar mega cell, a region crowded with placed cells, and the like, since there are no more space to insert a large scale capacitive cell. If only a small redundant region exists, as shown in FIG. 20A, the apparatus of the present embodiment can inserts a capacitive cell having a small width, as shown in FIG. 20B. Note that a plurality of capacitive cells different in width are previously prepared and a capacitive cell corresponding to a width of a redundant region is selected and inserted in the redundant region.

As described above, when there does not exist a redundant region that can receive a capacitive cell having a large size, the apparatus of the present embodiment can insert a capacitive cell having a small width. In addition to the effects of the third to fifth embodiments, it ensures that a capacitive cell is inserted in a vicinity of an I/O cell, a memory cell or any other similar mega cell, a region crowded with placed cells, and the like.

Eighth Embodiment

The present invention in an eighth embodiment provides an automatic placement and routing apparatus having a configuration, by way of example, similar to that of the apparatus of the first embodiment shown in FIG. 1. Accordingly, like placements and functions will not be described in detail.

Figure 21A:
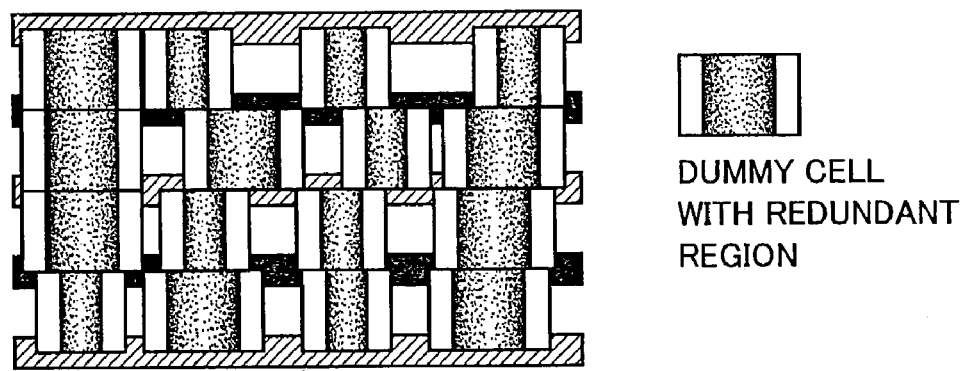
FIGS. 21A–21C are views for illustrating a method performed by an automatic placement and routing apparatus of an eighth embodiment of the present invention to insert a capacitive cell.
Figure 21A:
Figure 21B:
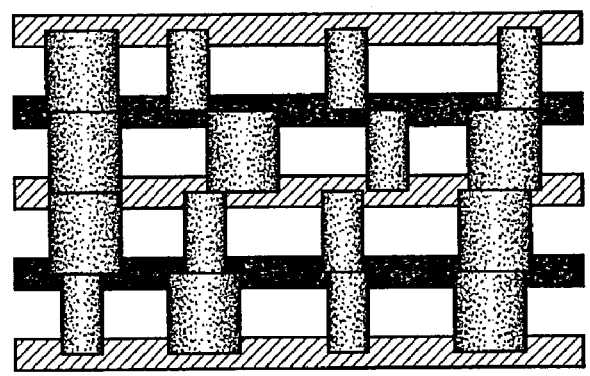
Figure 21C:
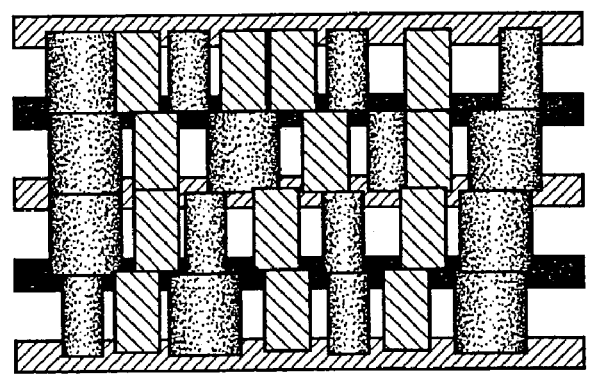

FIGS. 21A–21C are views for illustrating a method performed by the automatic placement and routing apparatus of the eighth embodiment to insert a capacitive cell. The apparatus of the present embodiment provides a simulation to detect a module having a high operation rate (a high probability of transition). Then, as shown in FIG. 21A, the apparatus replaces a macro cell included in the detected module with a dummy cell oversized laterally by a predetermined size to have a redundant region, and again effects an automatic placement.

When the apparatus again replaces the dummy cell having the redundant region with the original cell, a free region can be obtained between arranged macro cells, as shown in FIG. 21B. As shown in FIG. 21C, the apparatus inserts a capacitive cell in the free region.

Figure 22:
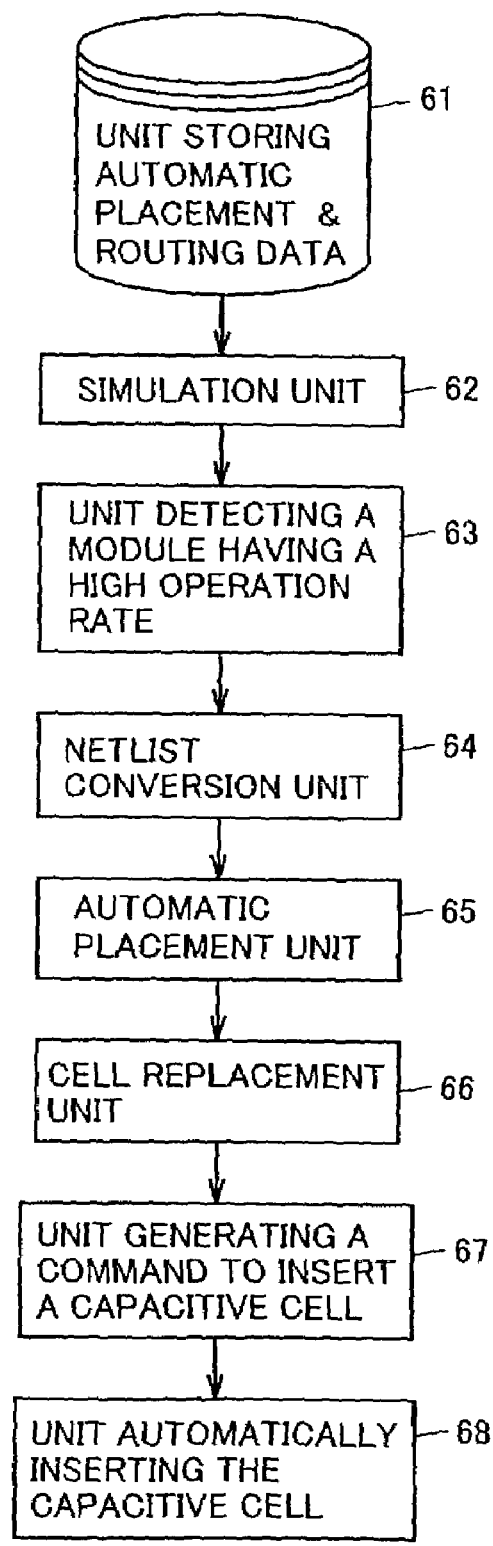
FIG. 22 is a block diagram illustrating a functional configuration of the apparatus of the eighth embodiment.

FIG. 22 is a block diagram showing a functional configuration of the automatic placement and routing apparatus of the eighth embodiment. The apparatus includes a data storage unit 61 storing automatic placement and routing data (a netlist information data for automatic placement and routing apparatus) output for example from a logic synthesis tool, a simulation unit 62 providing a simulation using the data stored in data storage unit 62, a detection unit 63 referring to a result of the simulation and the netlist data to detect a module having a high operation rate, a netlist conversion unit 64 replacing a macro cell included in the detected module with a dummy cell having a redundant region, and converting the netlist data, an automatic placement unit 65 providing an automatic placement using the netlist data, a cell replacement unit 66 replacing the automatically arranged dummy cell having a redundant region with the original cell, a command generation unit 67 generating a command to automatically insert a capacitive cell in a free region located in a vicinity of a macro cell replaced by cell replacement unit 66, and an automatic cell insertion unit 68 executing the command to automatically insert the capacitive cell.

Figure 23:
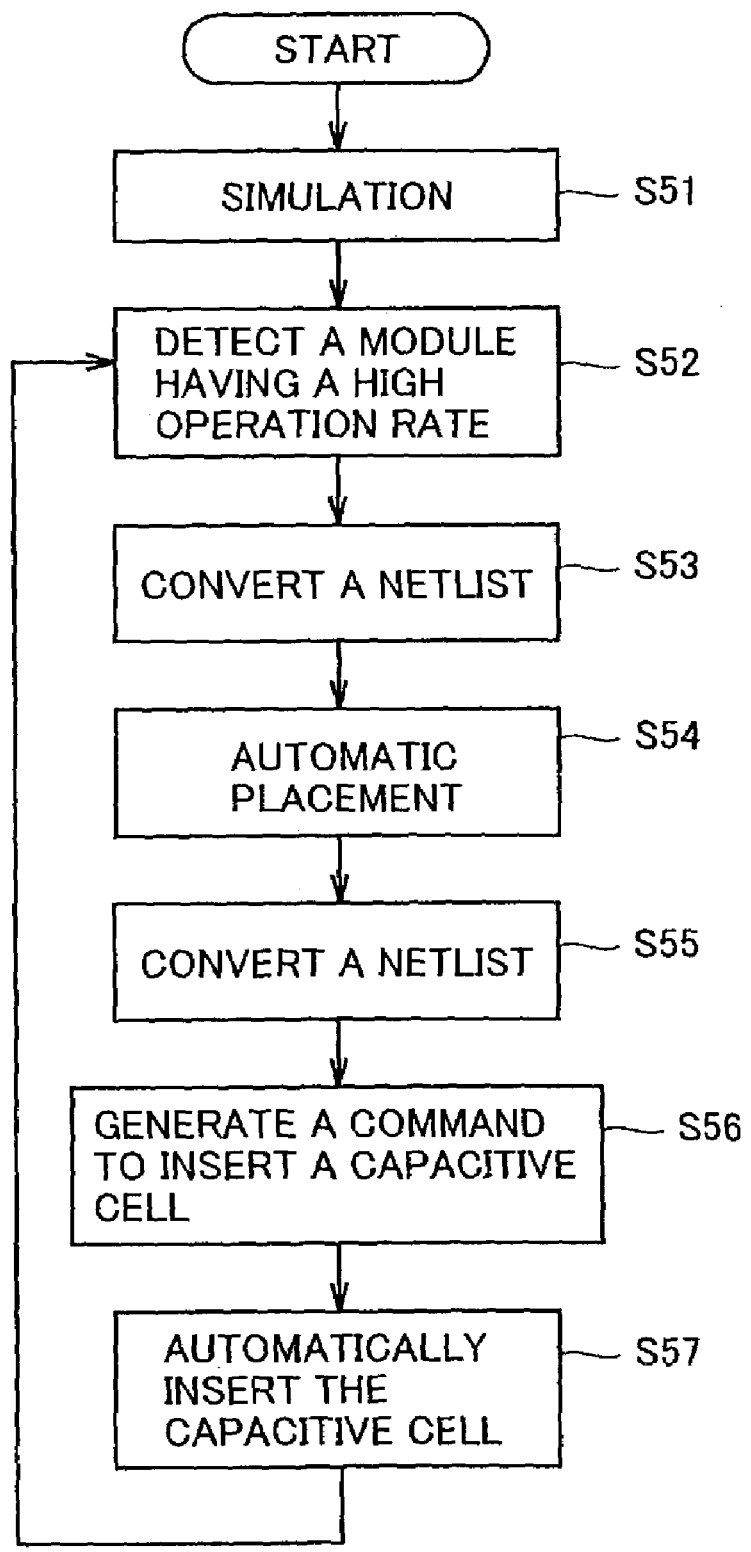
FIG. 23 is a flowchart for illustrating a procedure of a process performed by the apparatus of the eighth embodiment.

FIG. 23 is a flowchart for illustrating a procedure of a process performed by the automatic placement and routing apparatus of the eighth embodiment. Initially, simulation unit 62 uses automatic placement and routing data stored in data storage unit 61 and a test pattern (not shown) to provide a simulation of each module (S51).

Detection unit 63 refers to a result of the simulation and a netlist information data for automatic placement and routing apparatus to detect a module having a high operation rate (S52). If any module having a high operation rate is not detected, the process ends.

If a module having a high operation rate is detected, netlist conversion unit 64 refers to the netlist data to replace a macro cell included in the detected module with a dummy cell having a redundant region and converts the netlist data (S53).

Automatic replacement unit 65 then uses the netlist data to provide an automatic placement and creates a netlist reflecting the placement (S54). Cell replacement unit 66 refers to the created netlist to replace the dummy cell having the redundant region with the original cell and converts the netlist (S55).

Command generation unit 67 sets a region containing a macro cell or a mega cell contained in a module having a high operation rate and generates a command to insert a capacitive cell in the set region at a free region such that the capacitive cell does not overlap any placed cell (S56). Note that the capacitive cell to be inserted is a previously prepared cell that does not have any logic and only has a capacitive component.

Automatic cell insertion unit 68 then executes the command to automatically insert the capacitive cell in the free region (S57). The process then returns to S52 and repeats the subsequent process.

Thus in the present embodiment the automatic placement and routing apparatus replaces a macro cell contained in a module having a high operation rate with a dummy cell having a redundant region and provides an automatic placement and after it replaces the dummy cell having the redundant region with the original cell it detects a free region in a vicinity of the macro cell and automatically inserts a capacitive cell in the detected free region. This ensures that a module having a high operation rate is provided with a region receiving a capacitive cell and it can also provide the module's power supply line with an increased wiring capacitance to provide a steady power supply voltage and a negative effect of noise of power supply, ground and the like can be eliminated.

Ninth Embodiment

Figure 24A:
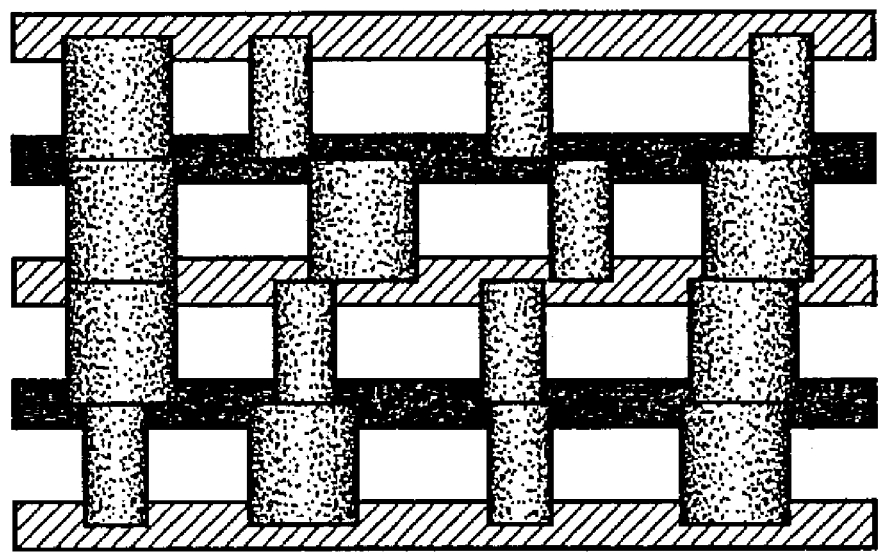
FIGS. 24A and 24B are views for illustrating a method performed by an automatic placement and routing apparatus of a ninth embodiment of the present invention to insert a capacitive cell.
Figure 24B:
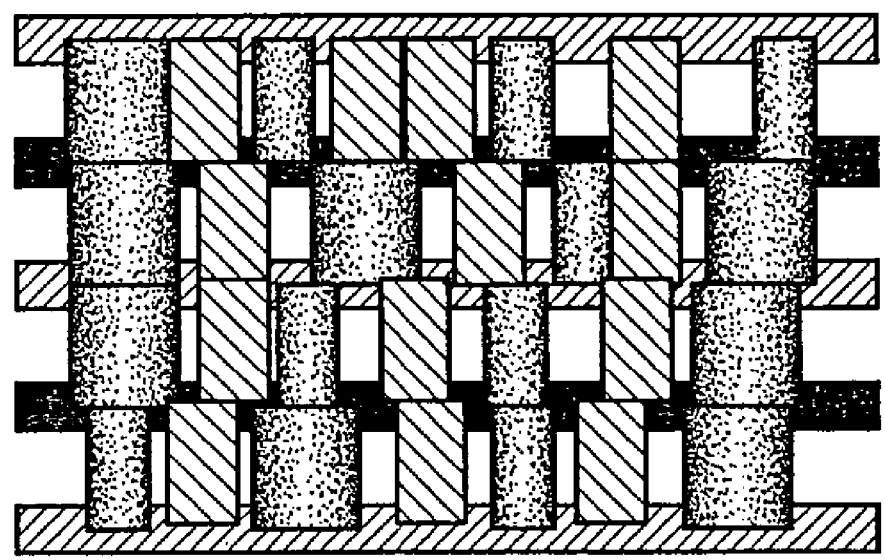

FIGS. 24A and 24B are views for illustrating a method performed by the apparatus of the ninth embodiment to insert a capacitive cell. The apparatus of the present embodiment provides a simulation to detect a module having a high operation rate (a high probability of transition). Then for a macro cell included in the detected module the apparatus sets an occupancy by cells of a region for placement. The apparatus sets the occupancy in floor-planning for effecting automatic placement and routing. Note that the occupancy is set to be lower than normal (i.e., lower than a predetermined value). Thus, as shown in FIG. 24A, a free region can be ensured between arranged macro cells. As shown in FIG. 24B, the apparatus inserts a capacitive cell in the free region.

FIGS. 24A and 24B are views for illustrating a method performed by the apparatus of the ninth embodiment to insert a capacitive cell. The apparatus of the present embodiment provides a simulation to detect a module having a high operation rate (a high probability of transition). Then for a macro cell included in the detected module the apparatus sets an occupancy by cells of a region for placement. The apparatus sets the occupancy in floor-planning for effecting automatic placement and routing. Note that the occupancy is set to be lower than normal. Thus, as shown in FIG. 24A, a free region can be ensured between arranged macro cells. As shown in FIG. 24B, the apparatus inserts a capacitive cell in the free region.

Figure 25:
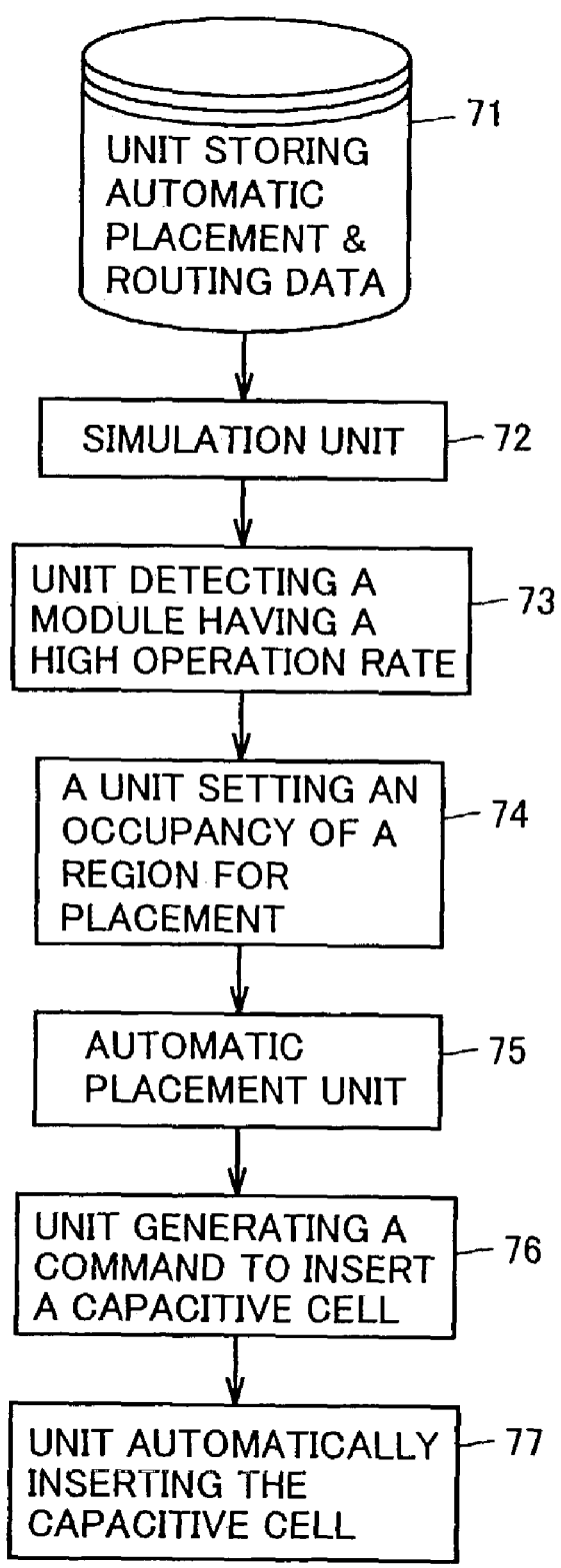
FIG. 25 is a block diagram illustrating a functional configuration of the apparatus of the ninth embodiment.

FIG. 25 is a block diagram showing a functional configuration of the automatic placement and routing apparatus of the ninth embodiment. The apparatus includes a data storage unit 71 storing automatic placement and routing data (a netlist information data for automatic placement and routing apparatus) output for example from a logic synthesis tool, a simulation unit 72 effecting a simulation using the data stored in data storage unit 71, a detection unit 73 referring to a result of the simulation and the netlist data to detect a module having a high operation rate, an occupancy setting unit 74 setting for a macro cell included in the detected module an occupancy by cells of a region for placement, the occupancy being lower than normal, an automatic placement unit 75 effecting an automatic placement in accordance with the set occupancy, a command generation unit 76 generating a command to automatically insert a capacitive cell in a free region located in a vicinity of a macro cell included in a module having a high operation rate that has automatically been arranged by automatic placement unit 75, and an automatic cell insertion unit 77 executing the command to automatically insert the capacitive cell.

Figure 26:
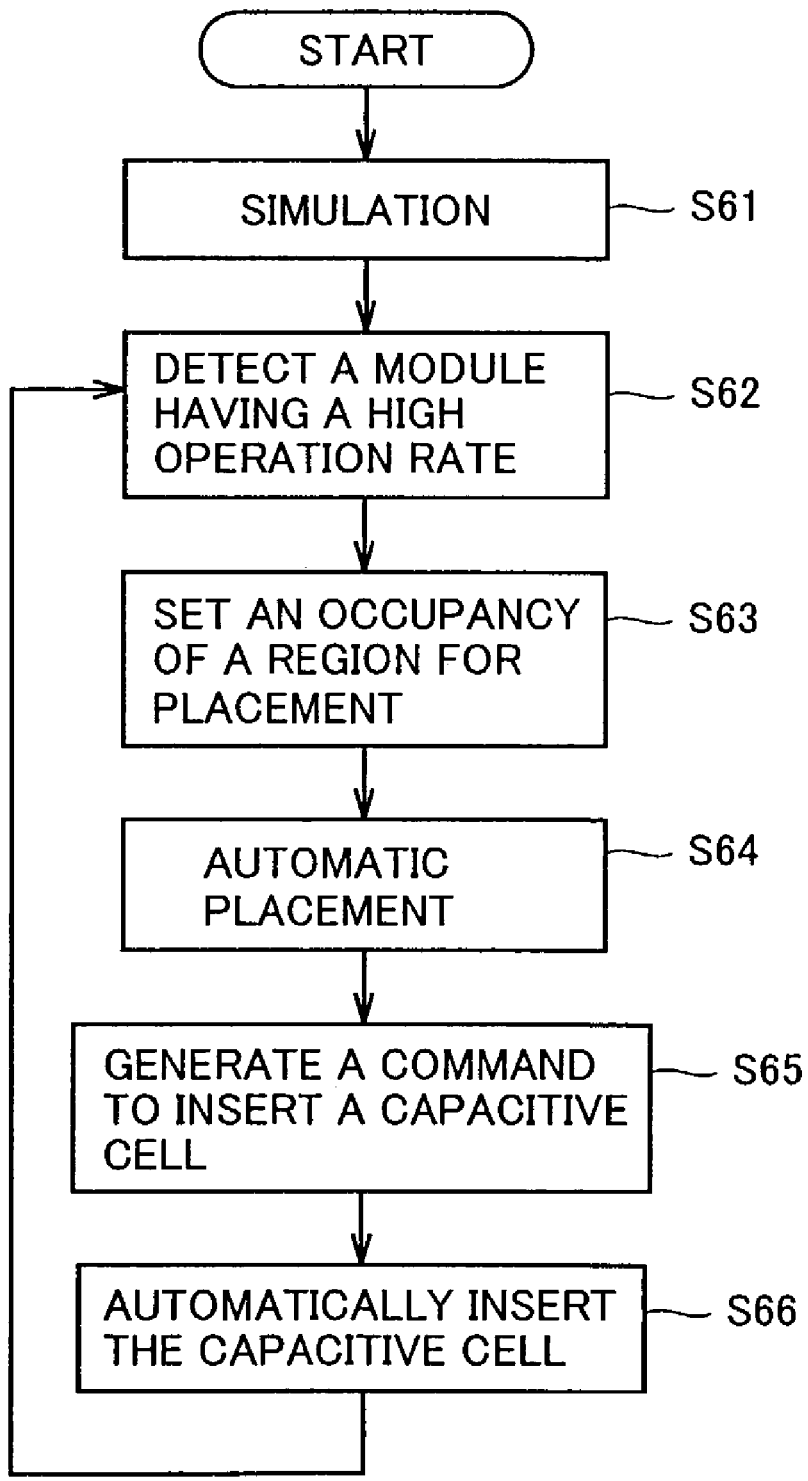
FIG. 26 is a flowchart for illustrating a procedure of a process performed by the apparatus of the ninth embodiment.

FIG. 26 is a flowchart for illustrating a procedure of a process performed by the apparatus of the ninth embodiment. Initially, simulation unit 72 uses automatic placement and routing data stored in data storage unit 71 and a test pattern (not shown) to provide a simulation of each module (S61).

Detection unit 73 refers to a result of the simulation and an automatic placement and routing netlist information file to detect a module having a high operation rate (S62). If any module having a high operation rate is not detected, the process ends.

If a module having a high operation rate is detected, then occupancy setting unit 74 sets for a macro cell included in the detected module an occupancy by cells of a region for placement (S63). It sets the occupancy in floor-planning for executing automatic placement and routing. Note that the occupancy is set to be lower than normal. A normal occupancy is set for cells other than the macro cell included in the module of the high operation rate.

Automatic placement unit 75 then uses the netlist data to provide an automatic placement and creates a netlist reflecting the placement (S64).

Command generation unit 76 sets a region including a macro cell or a mega cell included in a module having a high operation rate and generates a command to insert a capacitive cell in the set region at a free region such that the capacitive cell does not overlap any placed cell (S65). Note that the capacitive cell to be inserted is a previously prepared cell that does not have any logic and only has a capacitive component.

Automatic cell insertion unit 77 then executes the command to automatically insert the capacitive cell in the free region (S66). The process then returns to S62 to repeat the subsequent process.

Thus in the present embodiment the automatic placement and routing apparatus can set a low occupancy by cells of a region for placement for a macro cell including in a module having a high operation rate and provide an automatic placement, and detect a free region in a vicinity of the macro cell and automatically insert a capacitive cell in the detected free region. This ensures that the module having the high operation rate is provided with a region receiving a capacitive cell and it can also provides the module's power supply line with an increased capacitance to provide a steady power supply voltage and a negative effect of noise of power supply, ground and the like can be eliminated.

Tenth Embodiment

The present invention in a tenth embodiment provides an automatic placement and routing apparatus having a configuration, by way of example, similar to that of the apparatus of the first embodiment shown in FIG. 1. Accordingly, like placements or functions will not be described in detail.

Figure 27A:
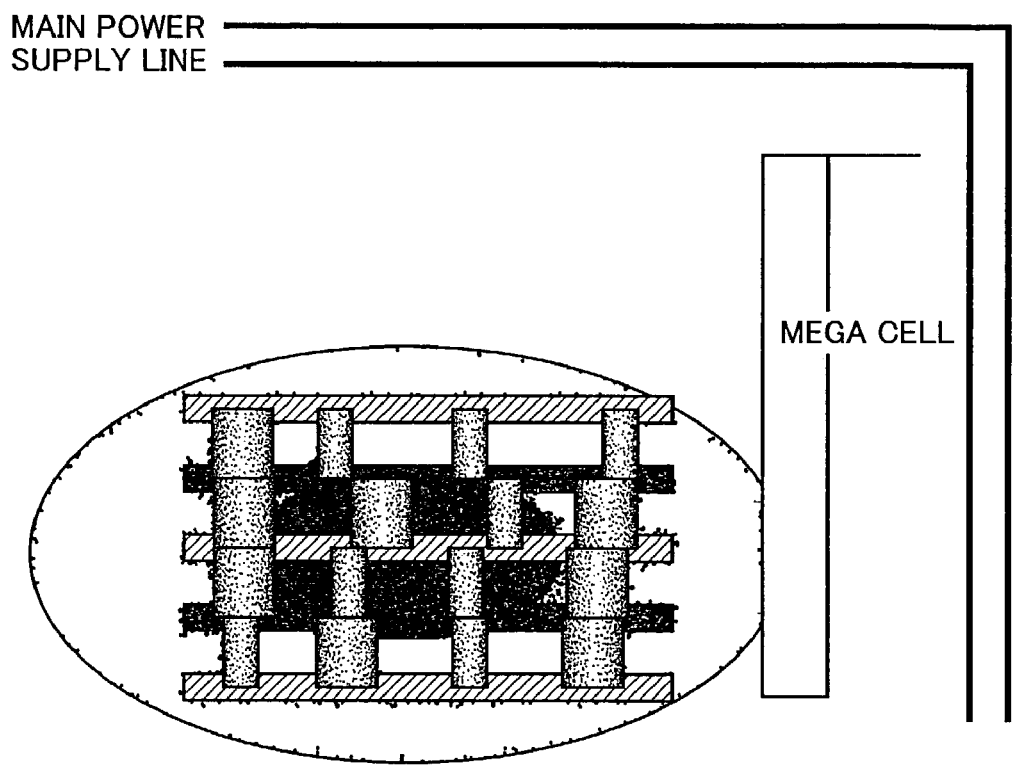
FIGS. 27A and 27B are views for illustrating a method performed by an automatic placement and routing apparatus of a tenth embodiment of the present invention to insert a capacitive cell.
Figure 27B:
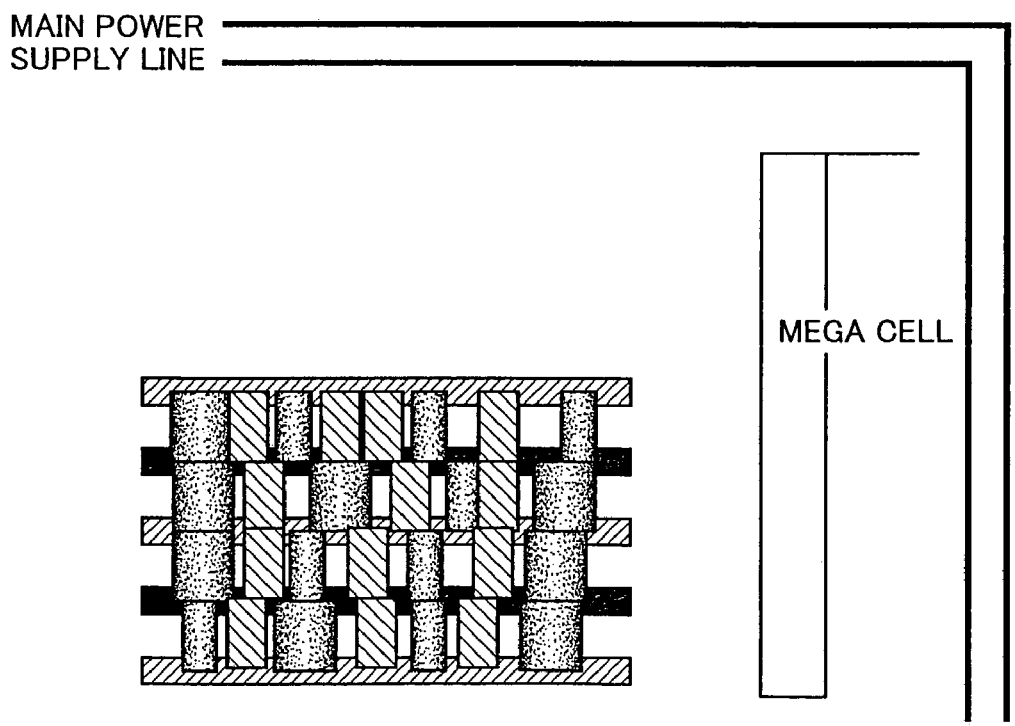

FIGS. 27A and 27B are views for illustrating a method performed by the apparatus of the tenth embodiment to insert a capacitive cell. Normally in a macro cell arranged in a region remote from a main power supply line or a power supply pad (a power supply point) a voltage drop violation is expected. In a region located in a vicinity of an I/O cell, a memory cell or any other similar mega cell it is often difficult to insert a capacitive cell for voltage drop reduction.

To overcome these disadvantages, a module remote from a main power supply line or a power supply pad (a supplying point), a module existing in a vicinity of a mega cell, or the like is detected and an occupancy by cells of a region for placement that is set in floor-planning for effecting automatic placement and routing is set to be lower than normal, and an automatic placement is effected. As shown in FIG. 27A, a free region can be obtained between arranged macro cells. As shown in FIG. 27B, the automatic placement and routing apparatus inserts a capacitive cell in the free region.

Figure 28:
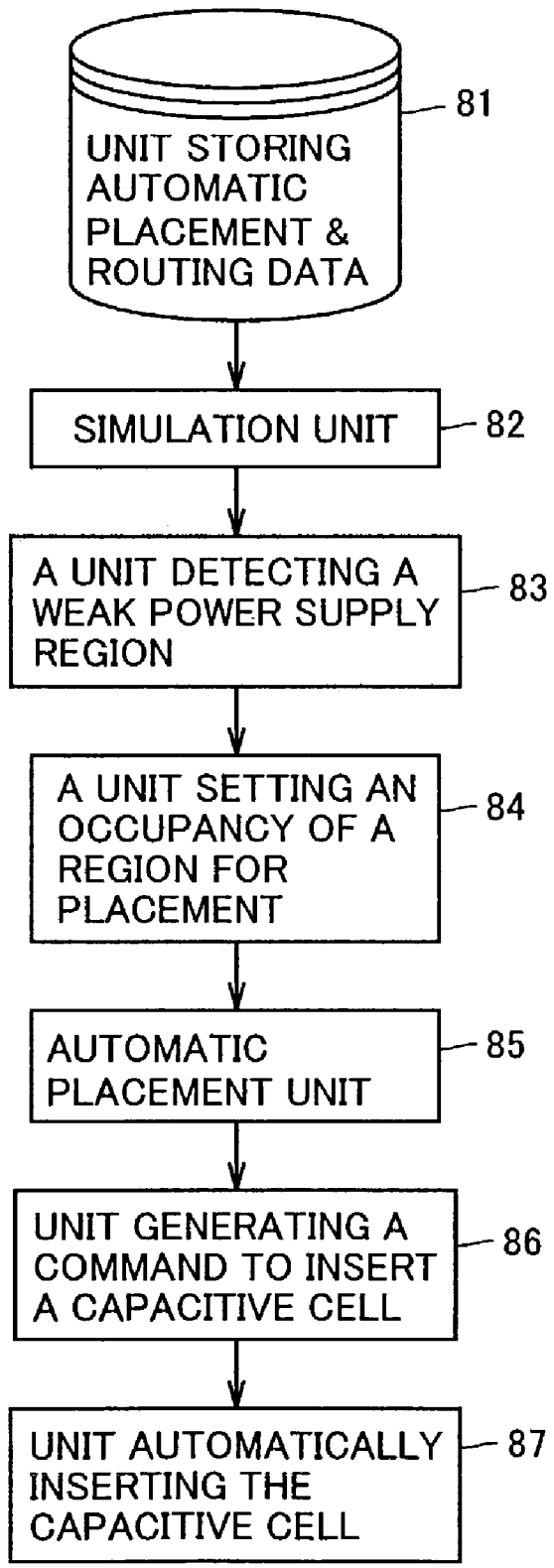
FIG. 28 is a block diagram illustrating a functional configuration of the apparatus of the tenth embodiment.

FIG. 28 is a block diagram showing a functional configuration of the automatic placement and routing apparatus of the tenth embodiment. The apparatus includes a data storage unit 81 storing automatic placement and routing data (a netlist information data for automatic placement and routing apparatus) output for example from a logic synthesis tool, a simulation unit 82 using the netlist data in data storage unit 81 to provide a simulation, a detection unit 83 referring to a result of the simulation and the netlist data to detect a module existing remote from a main power supply line or in a vicinity of a mega cell and also having a high operation rate (hereinafter referred to as a "weak power supply region"), an occupancy setting unit 84 setting a lower occupancy by cells of a region for placement than normal for a macro cell included in the detected region, an automatic placement unit 85 effecting an automatic placement in accordance with the set occupancy, a command generation unit 86 generating a command to automatically insert a capacitive cell in a free region located in a vicinity of a macro cell included in a module having a high operation rate that has automatically being arranged by automatic placement unit 85, and an automatic cell insertion unit 87 executing the command to automatically insert the capacitive cell.

Figure 29:
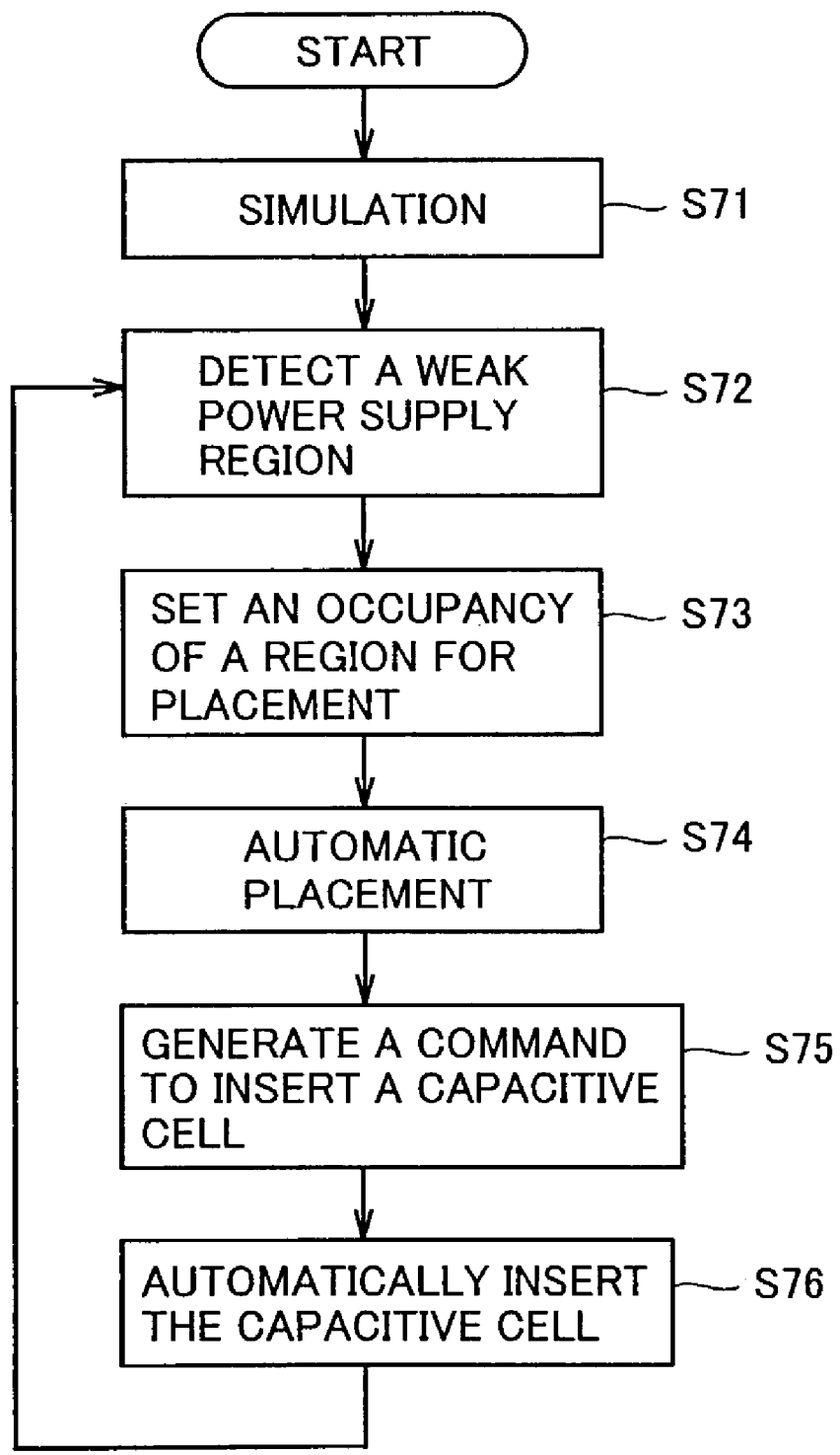
FIG. 29 is a flowchart for illustrating a procedure of a process performed by the apparatus of the tenth embodiment.

FIG. 29 is a flowchart for illustrating a procedure of a process performed by the apparatus of the tenth embodiment. Initially, simulation unit 82 uses an automatic placement and routing netlist information file stored in data storage unit 81 and a test pattern (not shown) to provide a simulation of each module (S71).

Detection unit 83 refers to a result of the simulation and the netlist data to detect a weak power supply region (S72). If any such region is not detected, the process ends.

If any such region is detected, occupancy setting unit 84 sets for a macro cell included in the detected region an occupancy by cells of a region for placement (S73). It sets the occupancy in floor-planning for effecting automatic placement and routing. Note that the occupancy is set to be lower than normal. A normal occupancy is set for cells other than the macro cell included in the module having the high operation rate.

Automatic placement unit 85 then uses the netlist data to effect an automatic placement and creates a netlist reflecting the placement (S74).

Command generation unit 86 sets a region including a macro cell or a mega cell included in the weak power supply region and generates a command to insert a capacitive cell in the set region at a free region such that the capacitive cell does not overlap any placed cell (S75). Note that the capacitive cell to be inserted is a previously prepared cell that does not have any logic and only has a capacitive component.

Automatic cell insertion unit 87 then executes the command to automatically insert the capacitive cell in the free region (S76). The process then returns to S72 and the subsequent process is repeated.

Thus in the present embodiment the automatic placement and routing apparatus can set a lower occupancy by cells of a region for placement for a macro cell included in a weak power supply region and provide an automatic placement, and detect a free region in a vicinity of the macro cell and automatically insert a capacitive cell in the detected free region. This ensures that the weak power supply region is provided with a region receiving a capacitive cell and a power supply line of a module having a high operation rate can also be provided with an increased wiring capacitance to provide steady power supply voltage and a negative effect of noise of power supply, ground and the like can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An automatic placement and routing apparatus comprising:
   a redundancy detection unit referring to layout data reflecting completed automatic placement and routing, to detect a redundant region in a region having a cell arranged therein;
   a cell insertion unit inserting a capacitive cell in the redundant region detected by said redundancy detection unit, said capacitive cell having a capacitive component and having no logic; and
   an output unit defining as a negative constant current source the capacitive cell inserted by said cell insertion unit, and outputting a value of a current for each instance including a value of a current of said capacitive cell.

2. The apparatus according to claim 1, further comprising an extraction unit detecting the number of capacitive cells inserted by said cell insertion unit and a position of each inserted cell to extract a value of a wiring capacitance.

3. The apparatus according to claim 1, further comprising:
   a timing analysis unit providing a timing analysis using said layout data;

an extraction unit referring to said layout data to extract a wiring capacitance of a power supply line;

a voltage drop analysis unit providing a voltage drop analysis using a result of an analysis output from said timing analysis unit and the wiring capacitance extracted by said extraction unit; and a violation detection unit detecting a location having a value of a voltage drop calculated by said voltage drop analysis unit and exceeding a reference value, wherein said redundancy detection unit detects the redundant region in a vicinity of the location detected by said violation detection unit.

4. The apparatus according to claim 1, further comprising:
a simulation unit providing a simulation using said layout data; and
a module detection unit detecting a module of a high operation rate with reference to a result of an analysis provided by said simulation unit, wherein said redundancy detection unit detects the redundant region in the module of the high operation rate detected by said module detection unit.

5. The apparatus according to claim 1, wherein said cell insertion unit moves a placed cell to obtain the redundant region and insert the capacitive cell in the redundant region.

6. The apparatus according to claim 1, wherein said cell insertion unit inserts in the redundant region having a small width the capacitive cell having a small width.

7. The apparatus according to claim 1, further comprising:
a simulation unit providing a simulation using an automatic placement and routing netlist;
a module detection unit detecting a module of a high operation rate with reference to a result of an analysis provided by said simulation unit;
an occupancy setting unit setting an occupancy of a region for placement by a cell included in said module having the high operation rate, said occupancy being set to be lower than a predetermined value; and
an automatic placement unit referring to said occupancy and using said netlist to effect an automatic placement wherein said redundancy detection unit detects the redundant region with reference to layout data generated by said automatic placement unit.

8. The apparatus according to claim 1, further comprising:
a simulation unit providing a simulation using an automatic placement and routing netlist;
a region detection unit referring to a result of an analysis provided by said simulation unit to detect a region existing remote from a power supplying point or in a vicinity of a mega cell and also having a high operation rate;
an occupancy setting unit setting an occupancy of a region for placement by a cell included in a region detected by said region detection unit, said occupancy being set to be lower than a predetermined value; and
an automatic placement unit referring to said occupancy to effect an automatic placement using said netlist, wherein said redundancy detection unit detects the redundant region with reference to layout data generated by said automatic placement unit.

9. The apparatus according to claim 1, further comprising:
a module designation unit designating a module having a high operation rate;

an occupancy setting unit setting an occupancy of a region for placement by a cell included in said module having the high operation rate, said occupancy being set to be lower than a predetermined value; and an automatic placement unit referring to said occupancy to effect an automatic placement using said netlist, wherein said redundancy detection unit detects the redundant region with reference to layout data generated by said automatic placement unit.

10. An automatic placement and routing apparatus comprising:
a redundancy detection unit referring to layout data reflecting completed automatic placement and routing, to detect a redundant region in a region having a cell arranged therein;
a cell insertion unit inserting a capacitive cell in the redundant region detected by said redundancy detection unit, said capacitive cell having a capacitive component and having no logic;
a timing analysis unit providing a timing analysis using said layout data; and
a macro cell detection unit detecting a timing critical macro cell with reference to a result of an analysis provided by said timing analysis unit, wherein said redundancy detection unit detects the redundant region in a vicinity of the timing critical macro cell detected by said macro cell detection unit.

11. An automatic placement and routing apparatus comprising:
a redundancy detection unit referring to layout data reflecting completed automatic placement and routing, to detect a redundant region in a region having a cell arranged therein;
a cell insertion unit inserting a capacitive cell in the redundant region detected by said redundancy detection unit, said capacitive cell having a capacitive component and having no logic;
a simulation unit providing a simulation using a netlist information data for said automatic placement and routing apparatus;
a module detection unit detecting a module of a high operation rate with reference to a result of an analysis provided by said simulation unit;
a netlist conversion unit replacing a cell included in said module having the high operation rate with a dummy cell having a redundant region, and converting a netlist;
an automatic placement unit providing an automatic placement using said netlist converted by said netlist conversion unit; and
a cell replacement unit detecting the dummy cell having the redundant region from layout data reflecting an automatic placement completed by said automatic placement unit, and replacing with an original cell the detected dummy cell having said redundant region, wherein said redundancy detection unit detects the redundant region with reference to layout data reflecting a replacement performed by said cell replacement unit with the original cell.

* * * * *